(12) United States Patent
Magni et al.

(10) Patent No.: US 8,997,684 B2
(45) Date of Patent: Apr. 7, 2015

(54) PREVENTION OF PARTICLE ADDERS WHEN CONTACTING A LIQUID MENISCUS OVER A SUBSTRATE

(75) Inventors: Enrico Magni, Pleasanton, CA (US);
Suresh Gupta, Fremont, CA (US);
Mark Gahagan, San Francisco, CA (US); Eric Lenz, Pleasanton, CA (US);
Mike Ravkin, Los Altos, CA (US)

(73) Assignee: Lam Research Corporation, Fremont, CA (US)

( * ) Notice: Subject to any disclaimer, the term of this patent is extended or adjusted under 35 U.S.C. 154(b) by 634 days.

(21) Appl. No.: 13/250,872

(22) Filed: Sep. 30, 2011

(65) Prior Publication Data
US 2013/0084392 A1    Apr. 4, 2013

(51) Int. Cl.
| | |
|---|---|
| *B05C 11/00* | (2006.01) |
| *H01L 21/67* | (2006.01) |
| *B05C 11/10* | (2006.01) |
| *B05C 5/02* | (2006.01) |
| *H01L 21/677* | (2006.01) |
| *B05D 3/10* | (2006.01) |
| *B05D 3/00* | (2006.01) |

(52) U.S. Cl.
CPC ...... *H01L 21/67086* (2013.01); *B05C 11/1036* (2013.01); *B05C 11/1039* (2013.01); *B05C 5/0254* (2013.01); *B05D 3/104* (2013.01); *B05D 3/002* (2013.01); *H01L 21/6776* (2013.01); *Y10S 134/902* (2013.01)

(58) Field of Classification Search
CPC ............ B05C 11/1036; B05C 11/1039; B05C 11/1044; B05C 5/0216; B05C 5/0254; B05D 3/104; B05D 3/002; B08B 3/02; B08B 3/022
USPC ......... 118/410–412, 50; 134/95.2, 102.3, 902
See application file for complete search history.

(56) References Cited

U.S. PATENT DOCUMENTS

| | | | | |
|---|---|---|---|---|
| 5,660,642 | A | * | 8/1997 | Britten ............................ 134/30 |
| 6,495,005 | B1 | * | 12/2002 | Colgan et al. ............. 204/224 R |
| 2008/0266367 | A1 | * | 10/2008 | Ravkin et al. ................... 347/85 |

FOREIGN PATENT DOCUMENTS

JP         2003-151948      *  5/2003

* cited by examiner

*Primary Examiner* — Laura Edwards
(74) *Attorney, Agent, or Firm* — Martine Penilla Group, LLP

(57) ABSTRACT

A method for meniscus processing a substrate is provided. The method initiates with generating a meniscus spanning at least a length of the substrate. A pre-wetting liquid or vapor is dispensed. A substrate is moved through the dispensed pre-wetting liquid or vapor and the meniscus. The dispensed pre-wetting vapor condenses a pre-wetting liquid over a region of the substrate adjacent to a region of the substrate where the meniscus is generated. The pre-wetting liquid is deposited without substantially generating surface flow of the pre-wetting liquid on the substrate, and the pre-wetting liquid prevents the leading edge of the meniscus from contacting a dry surface region of the substrate.

14 Claims, 21 Drawing Sheets

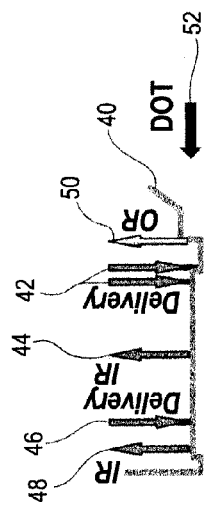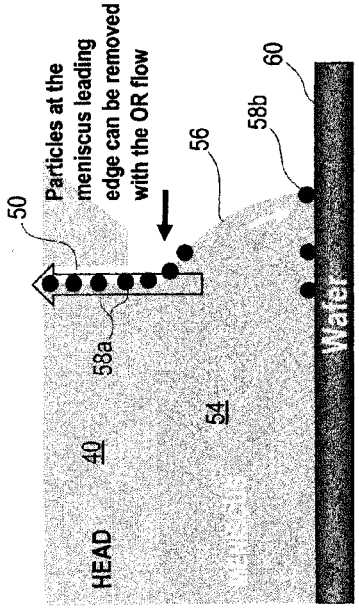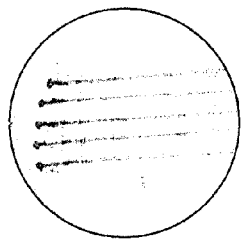
Fig. 3A
Fig. 3B
Fig. 3C
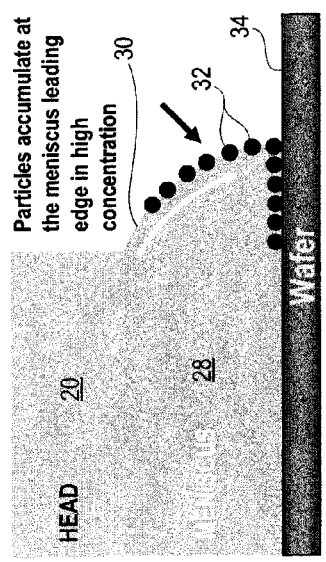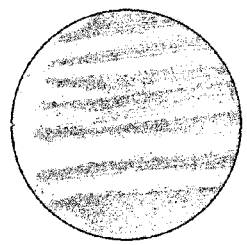
Fig. 2A
Fig. 2B
Fig. 2C

Advancing droplet

The motion of the surface of a liquid drop sliding on a surface has been compared to the motion of the trucks on a moving caterpillar P.G. de Gennes, Rev. Modern Phys, 57, 1985, 827

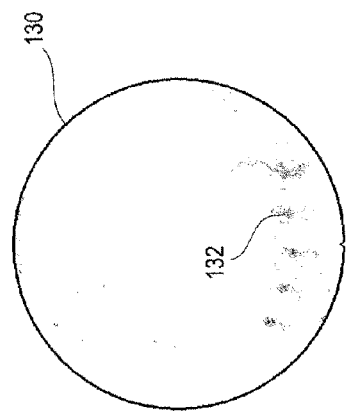
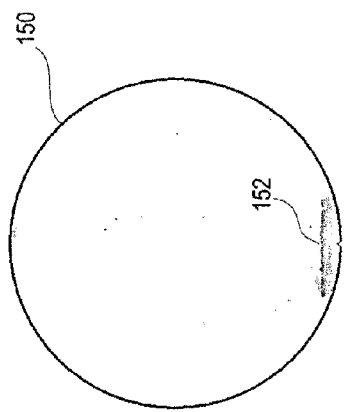
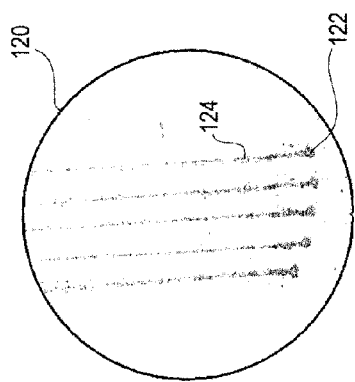
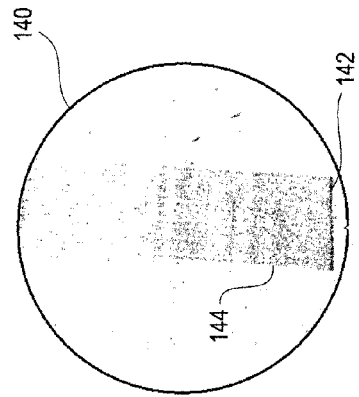

3.2 mm at wafer center (after T expansion)
20° from normal
0.3mm gap 2.5 mm at wafer center (after T expansion)
40° from normal
0.3 mm gap 3.1 mm at wafer center (after T expansion)
20° from normal
0.5mm gap 5.0 mm at wafer center (after T expansion)
40° from normal
0.5 mm gap

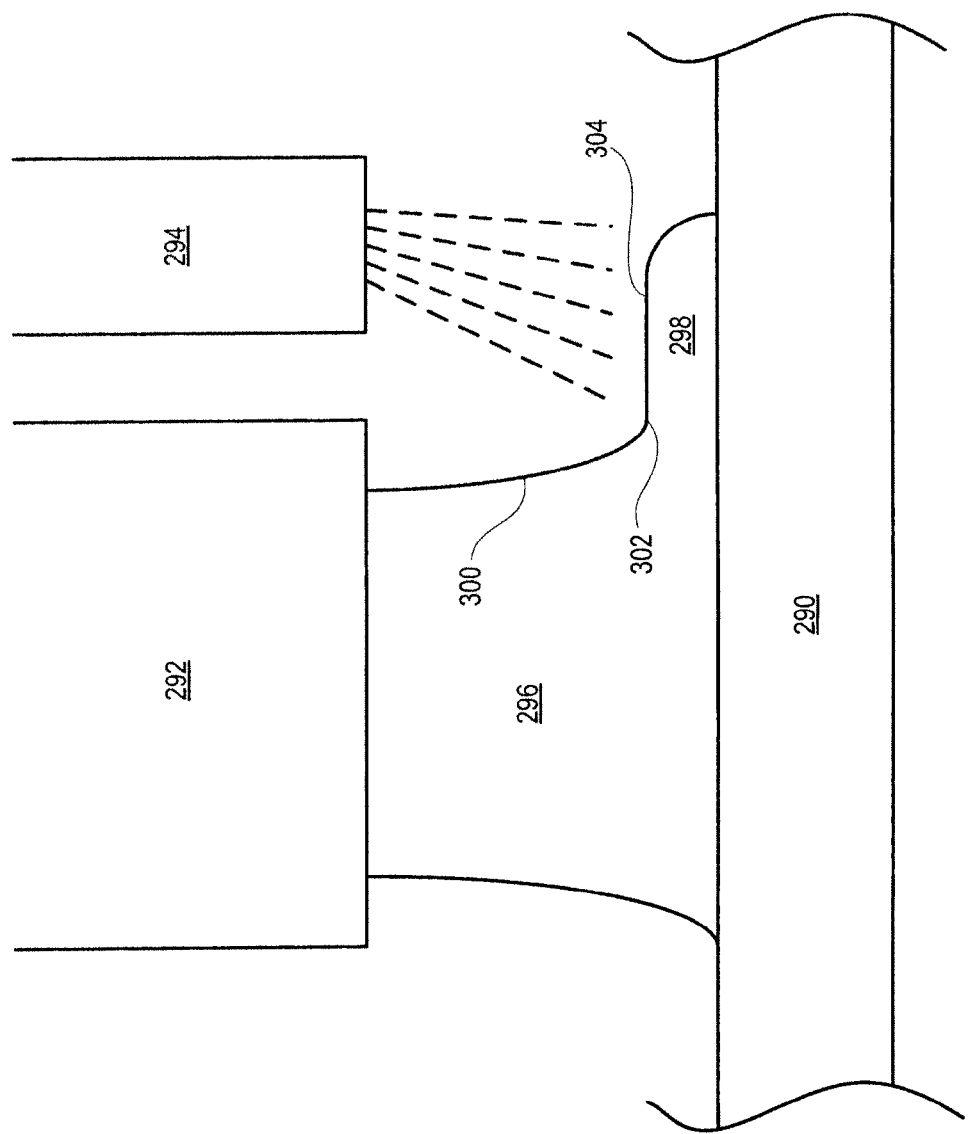

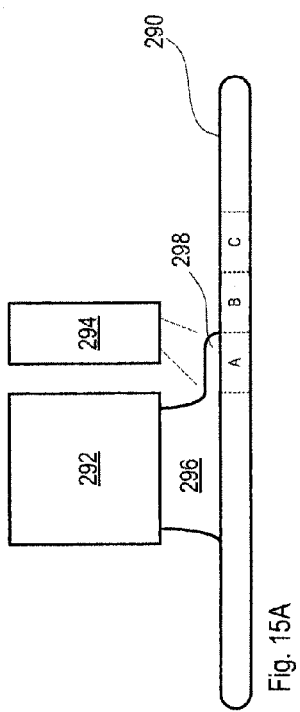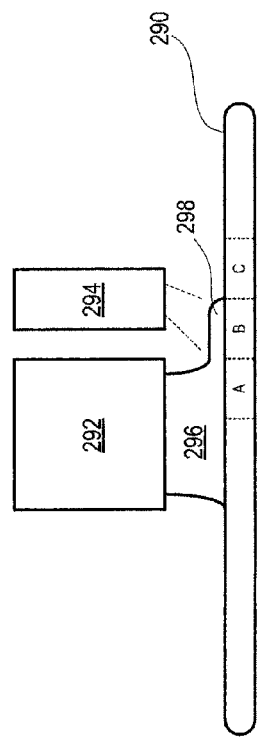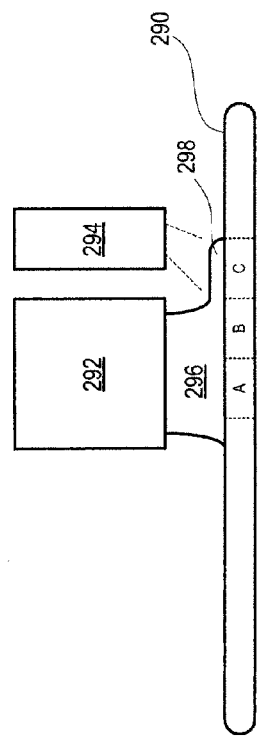

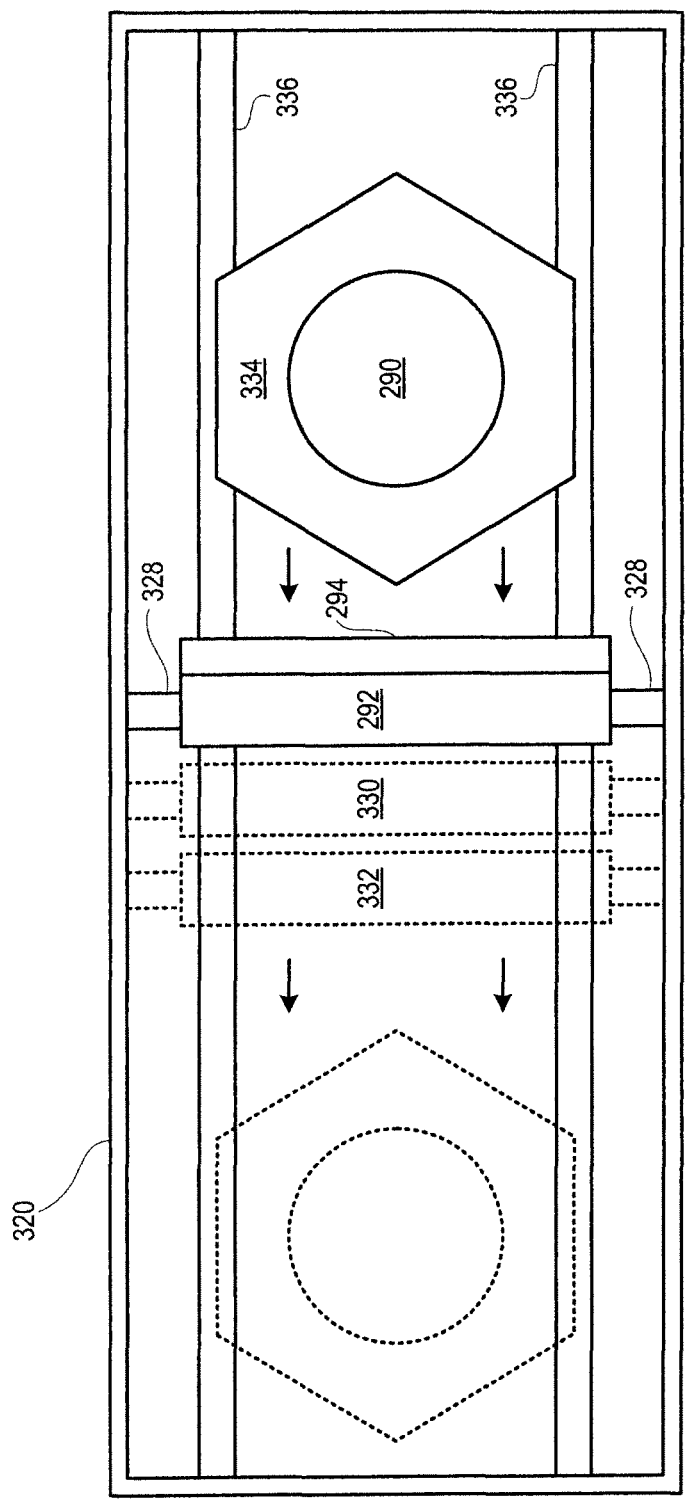

PREVENTION OF PARTICLE ADDERS WHEN CONTACTING A LIQUID MENISCUS OVER A SUBSTRATE

CROSS REFERENCE TO RELATED APPLICATION

This application is related to U.S. patent application Ser. No. 10/817,398, now U.S. Pat. No. 7,614,411, filed Apr. 1, 2004, entitled "CONTROLS OF AMBIENT ENVIRONMENT DURING WAFER DRYING USING PROXIMITY HEAD," and to U.S. patent application Ser. No. 12/475,466, now U.S. Pat. No. 8,813,764, filed May 29, 2009, entitled "METHOD AND APPARATUS FOR PHYSICAL CONFINEMENT OF A LIQUID MENISCUS OVER A SEMICONDUCTOR WAFER," and to U.S. patent application Ser. No. 13/089,186, filed Apr. 18, 2011, entitled "APPARATUS AND METHOD FOR REDUCING SUBSTRATE PATTERN COLLAPSE DURING DRYING OPERATIONS." The aforementioned patent applications are incorporated herein by reference in their entirety for all purposes.

BACKGROUND

In the fabrication of semiconductor devices such as integrated circuits, memory cells, and the like, a series of manufacturing operations are performed to define features on semiconductor wafers ("wafers"). The wafers (or substrates) include integrated circuit devices in the form of multi-level structures defined on a silicon substrate. At a substrate level, transistor devices with diffusion regions are formed. In subsequent levels, interconnect metallization lines are patterned and electrically connected to the transistor devices to define a desired integrated circuit device. Also, patterned conductive layers are insulated from other conductive layers by dielectric materials.

During the series of manufacturing operations, the wafer surface is exposed to various types of contaminants. Essentially any material present in a manufacturing operation is a potential source of contamination. For example, sources of contamination may include process gases, chemicals, deposition materials, and liquids, among others. The various contaminants may deposit on the wafer surface and at the wafer edge in particulate form. Particulate contamination can cause devices within the vicinity of the contamination to be inoperable. It should be appreciated that the manufacturing operations for flat panel displays suffer from the same shortcomings of the integrated circuit manufacturing discussed above.

During processing of a substrate by a liquid meniscus, such contamination may be spread about the wafer by the meniscus itself. This can result in the spread of the contaminating particles to other portions of the substrate, possibly rendering other devices or features inoperable in the process.

In view of the foregoing, there is a need for apparatus and methods of processing wafers that are effective in preventing the spread of contaminants upon a wafer surface. It is in this context that embodiments of the invention arise.

SUMMARY OF THE INVENTION

Broadly speaking, the present invention fills these needs by providing a method for meniscus processing a substrate including a prewetting operation which inhibits the spread of particle contaminants across the substrate surface. It should be appreciated that the present invention can be implemented in numerous ways, including as a process, an apparatus, or a system. Several inventive embodiments of the present invention are described below.

In one embodiment, a method for meniscus processing a substrate is provided. The method initiates with generating a meniscus spanning at least a length of the substrate. A pre-wetting liquid is dispensed. A substrate is moved through the dispensed pre-wetting liquid and the meniscus. The dispensed pre-wetting liquid deposits the pre-wetting liquid over a region of the substrate adjacent to a region of the substrate where the meniscus is generated. The pre-wetting liquid is deposited without substantially generating surface flow of the pre-wetting liquid on the substrate, and the pre-wetting liquid prevents the leading edge of the meniscus from contacting a dry surface region of the substrate.

In one embodiment, dispensing the pre-wetting liquid includes flowing the pre-wetting liquid onto the region of the substrate adjacent to the leading edge of the meniscus.

In one embodiment, dispensing the pre-wetting liquid includes dripping the pre-wetting liquid onto the region of the substrate adjacent to the leading edge of the meniscus.

In one embodiment, the pre-wetting fluid includes de-ionized water.

In one embodiment, the pre-wetting fluid includes isopropyl alcohol.

In another embodiment, a method for meniscus processing a substrate is provided. The method initiates with generating a meniscus spanning at least a length of the substrate. A pre-wetting vapor is dispensed. A substrate is moved through the dispensed pre-wetting vapor and the meniscus. The dispensed pre-wetting vapor condenses a pre-wetting liquid over a region of the substrate adjacent to a region of the substrate where the meniscus is generated. The pre-wetting liquid is deposited without substantially generating surface flow of the pre-wetting liquid on the substrate, and the pre-wetting liquid prevents the leading edge of the meniscus from contacting a dry surface region of the substrate.

In one embodiment, the pre-wetting vapor is generated by mixing the pre-wetting liquid in a carrier gas stream.

In one embodiment, generating the pre-wetting fluid includes heating the pre-wetting vapor.

In one embodiment, the carrier gas stream includes nitrogen.

In one embodiment, the pre-wetting liquid includes de-ionized water or isopropyl alcohol.

In another embodiment, a system for meniscus processing a substrate is provided. The system includes a first proximity head having a plurality of first delivery conduits for providing a first process liquid to a first surface of the substrate and a plurality of first return conduits for removing the process liquid from the first surface of the substrate. The plurality of first delivery conduits and the plurality of first return conduits generate a first meniscus spanning at least a length of the first surface of the substrate. A second proximity head is positioned opposite the first proximity head, the second proximity head having a plurality of second delivery conduits for providing a second process liquid to a second surface of the substrate and a plurality of second return conduits for removing the second process liquid from the second surface of the substrate. The plurality of second delivery conduits and the plurality of second return conduits generate a second meniscus spanning at least a length of the second surface of the substrate, the second meniscus opposing the first meniscus. A pre-wetting dispenser is positioned adjacent to the first proximity head, the pre-wetting dispenser having a plurality of pre-wetting conduits for depositing a pre-wetting liquid over a region of the substrate adjacent to a region of the substrate where the meniscus is generated. A conveyer is provided for moving the substrate through the dispensed pre-wetting liquid and the meniscus. A controller controls the conveyer to move the substrate and the pre-wetting dispenser to deposit the pre-wetting liquid such that the pre-wetting liquid is deposited without substantially generating surface flow of the pre-wetting liquid once deposited on the substrate. The pre-wetting liquid prevents the leading edge of the meniscus from contacting a dry surface region of the substrate.

In one embodiment, the plurality of pre-wetting conduits are angled towards a direction of travel of the substrate during meniscus processing.

In one embodiment, the pre-wetting dispenser is coupled to the first proximity head.

In one embodiment, the pre-wetting conduits are configured to flow or drip the pre-wetting liquid onto the region of the substrate adjacent to the leading edge of the first meniscus.

In one embodiment, the plurality of pre-wetting conduits are configured to deposit the pre-wetting liquid by ejecting a vapor onto a region of the substrate adjacent to a region of the substrate where the meniscus is generated, and condensing the pre-wetting liquid from the vapor, the vapor including the pre-wetting liquid and a carrier gas.

In one embodiment, the pre-wetting dispenser includes a heater for heating the vapor.

In one embodiment, the carrier gas includes nitrogen.

In one embodiment, the pre-wetting liquid includes de-ionized water or isopropyl alcohol.

In another embodiment, a prewetting head for depositing a prewetting film onto a surface of a substrate is provided. The prewetting head is defined as comprising a housing having a first side which faces a proximity head when present, and a second side which faces a substrate when present. A supply bore is defined within the housing for receiving a prewetting fluid. A plurality of delivery conduits are also defined within the housing, the delivery conduits for delivering the prewetting fluid to the substrate. Each of the delivery conduits extends from the supply bore to the second side of the housing, and each of the delivery conduits is oriented at an angle away from normal to the substrate and towards the first side of the housing. The prewetting head additionally includes a connector for connecting the housing to the proximity head.

In one embodiment, each of the delivery conduits has an angled orientation of approximately 0 to 40 degrees from normal to the substrate surface.

In one embodiment, one or more heaters are positioned within the housing adjacent to the delivery conduits on a side opposite the proximity head.

In one embodiment, one or more heaters are positioned within the housing adjacent to the delivery conduits on a same side as the proximity head.

Other aspects and advantages of the present invention will become apparent from the following detailed description, taken in conjunction with the accompanying drawings, illustrating by way of example the principles of the present invention.

BRIEF DESCRIPTION OF THE DRAWINGS

The present invention will be readily understood by the following detailed description in conjunction with the accompanying drawings. To facilitate this description, like reference numerals designate like structural elements.

FIG. 2A illustrates a schematic cross section of a physical confinement-type proximity head, in accordance with an embodiment of the invention.

FIG. 2B illustrates particle behavior at the meniscus leading edge of a physical confinement-type proximity head, in accordance with an embodiment of the invention.

FIG. 2C illustrates the particle streaking resulting from application of a liquid meniscus to a substrate surface using a physical confinement-type proximity head, in accordance with an embodiment of the invention.

FIG. 3A illustrates a schematic cross section of an outer return-type proximity head, in accordance with an embodiment of the invention.

FIG. 3B illustrates particle behavior at the meniscus leading edge of an outer return-type proximity head, in accordance with an embodiment of the invention.

FIG. 3C illustrates the particle streaking resulting from application of a liquid meniscus to a substrate surface using an outer return-type proximity head, in accordance with an embodiment of the invention.

FIGS. 8A and 8B illustrate the effect of a prewetting layer applied to an entire surface of a substrate, in accordance with an embodiment of the invention.

FIGS. 9A and 9B illustrate the effect of prewetting on a substrate having a scratched surface, in accordance with an embodiment of the invention.

FIG. 14 illustrates meniscus processing of a substrate with a prewet operation, in accordance with an embodiment of the invention.

FIGS. 15A, 15B, and 15C illustrate various stages of processing of a substrate, in accordance with an embodiment of the invention.

FIG. 16 illustrates a processing system for processing a substrate, in accordance with an embodiment of the invention.

DETAILED DESCRIPTION OF THE PREFERRED EMBODIMENTS

Several embodiments for the prevention of particle adders when contacting a liquid meniscus over a substrate are now described. It will be obvious, however, to one skilled in the art, that the present invention may be practiced without some or all of these specific details. In other instances, well known process operations have not been described in detail in order not to unnecessarily obscure the present invention.

Figure 1:
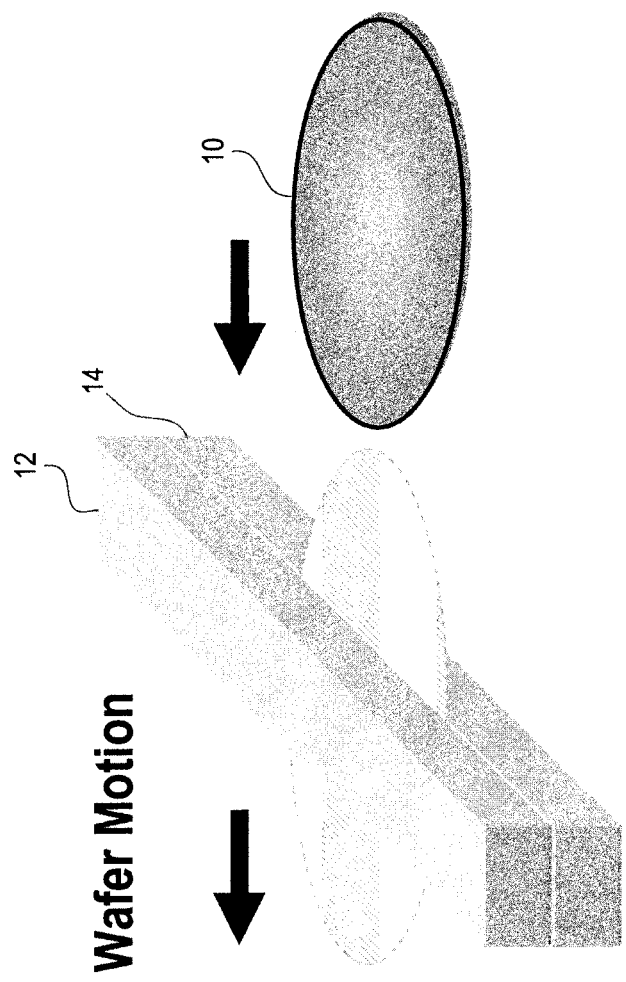
FIG. 1 illustrates a system for meniscus processing a substrate, in accordance with an embodiment of the invention.

FIG. 1 illustrates a system for meniscus processing a substrate, in accordance with an embodiment of the invention. A substrate 10 is processed by transporting it through two opposing proximity heads 12 and 14. The proximity heads 12 and 14 each generate a meniscus which contacts the respective surface of the substrate. Systems for meniscus processing are described in U.S. Pat. No. 7,234,477 to de Larios et al., entitled "Method and Apparatus for Drying Semiconductor Wafer Surfaces Using a Plurality of Inlets and Outlets Held in Close Proximity to the Wafer Surfaces," U.S. Pat. No. 7,350,316 to Woods et al., entitled "Meniscus Proximity System for Cleaning Semiconductor Substrate Surface," and U.S. Pat. No. 7,069,937 to Garcia et al., entitled "Vertical Proximity Processor," the disclosures of which is herein incorporated by reference in its entirety for all purposes. Various types of processing operations can be accomplished using proximity heads, such as deposition, etching, cleaning and other types of operations. It will be appreciated that the principles of the invention as described elsewhere herein are applicable to any device or system which utilizes a meniscus that moves relative to a substrate surface to process the substrate.

FIG. 2A illustrates a schematic cross section of a physical confinement-type proximity head, in accordance with an embodiment of the invention. The proximity head 20 includes a delivery conduit 22 for delivering the meniscus liquid to the substrate surface and an inner return conduit 24 which removes the meniscus liquid from the substrate surface via application of suction/vacuum. The direction of travel of the substrate is indicated by arrow 26. This type of proximity head relies upon physical confinement of the meniscus between the proximity head 20 and the substrate surface to maintain the meniscus in its proper configuration relative to the proximity head 20.

FIG. 2B illustrates particle behavior at the meniscus leading edge of a physical confinement-type proximity head, in accordance with an embodiment of the invention. As shown, the proximity head 20 generates a meniscus 28 across the surface of substrate 34. However, particles 32 have a tendency to accumulate at the meniscus leading edge 30 in high concentration.

FIG. 2C illustrates the particle streaking resulting from application of a liquid meniscus to a substrate surface using a physical confinement-type proximity head, in accordance with an embodiment of the invention. In the illustrated example, a large number of CuO particles are initially added to the substrate surface in the shape of 7 dots. As demonstrated, particles which accumulate and are trapped at the meniscus leading edge are dragged over the surface of the substrate as the meniscus is applied, resulting in large streaks across the surface of the substrate.

FIG. 3A illustrates a schematic cross section of an outer return-type proximity head, in accordance with an embodiment of the invention. The proximity head 40 includes delivery conduits 42 and 46, as well as inner return conduits 44 and 48. The proximity head 40 additionally includes an outer return conduit 50, located at the leading portion of the proximity head 40, for removing meniscus liquid from the leading edge of the meniscus via application of suction/vacuum. A direction of travel of a wafer is indicated by arrow 52.

FIG. 3B illustrates particle behavior at the meniscus leading edge of an outer return-type proximity head, in accordance with an embodiment of the invention. The proximity head 40 generates a meniscus 54 over a surface of the wafer 60. The outer return 50 of the proximity head 40 generates a flow such that liquid at the portion of the leading edge 56 near the outer return 50 flows into the outer return 50. Thus, particles 58a located at this portion of the leading edge 56 are removed by the flow generated by the outer return 50. However, other particles 58b located at a portion of the leading edge 56 near the wafer 60 experience a flow towards the wafer 60. Thus, such particles 58b are trapped at this portion of the outer edge (three-phase contact line) and can be dragged across the surface of the wafer 60.

FIG. 3C illustrates the particle streaking resulting from application of a liquid meniscus to a substrate surface using an outer return-type proximity head, in accordance with an embodiment of the invention. In the illustrated example, a large number of CuO particles are initially added to the substrate surface in the shape of 5 dots. As shown, the quantity of particles streaking across the wafer surface with the outer return-type proximity head is reduced as compared to a physical confinement-type proximity head. However, even with the outer return-type proximity head, there is noticeable trapping and streaking of particles across the substrate surface.

Figure 4A:
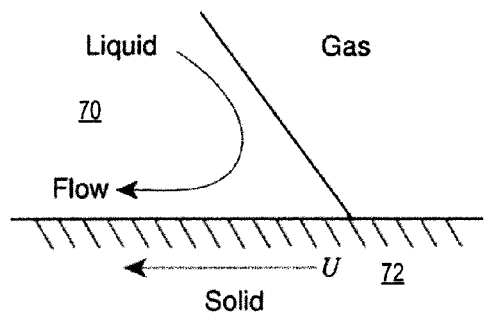
FIGS. 4A and 4B illustrate the flow present in an advancing liquid drop over a solid surface, in accordance with an embodiment of the invention.
Figure 4B:
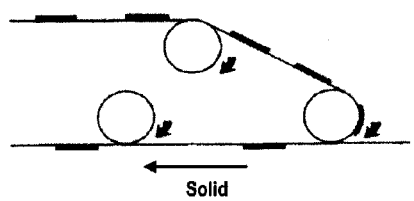

FIGS. 4A and 4B illustrate the flow present in an advancing liquid drop over a solid surface, in accordance with an embodiment of the invention. When a liquid drop 70 advances on the surface of a solid 72, a surface flow is present in the liquid drop to replenish dislodged molecules. The flow is directed towards the solid surface on the advancing side of the drop and away from the solid surface on the receding side of the drop. This flow has been analogized to the motion of trucks on a moving caterpillar. See P.G. de Gennes, Rev. Modern Phys, 57, 1985, 827.

It is believed that a similar surface flow is present in the case of a substrate advancing through a meniscus leading edge generated by a proximity head. That is, the surface flow at the meniscus leading edge is directed towards the substrate surface. As a result, particles which are present on the surface of the meniscus leading edge are directed towards the substrate surface by the surface flow.

Figure 4C:
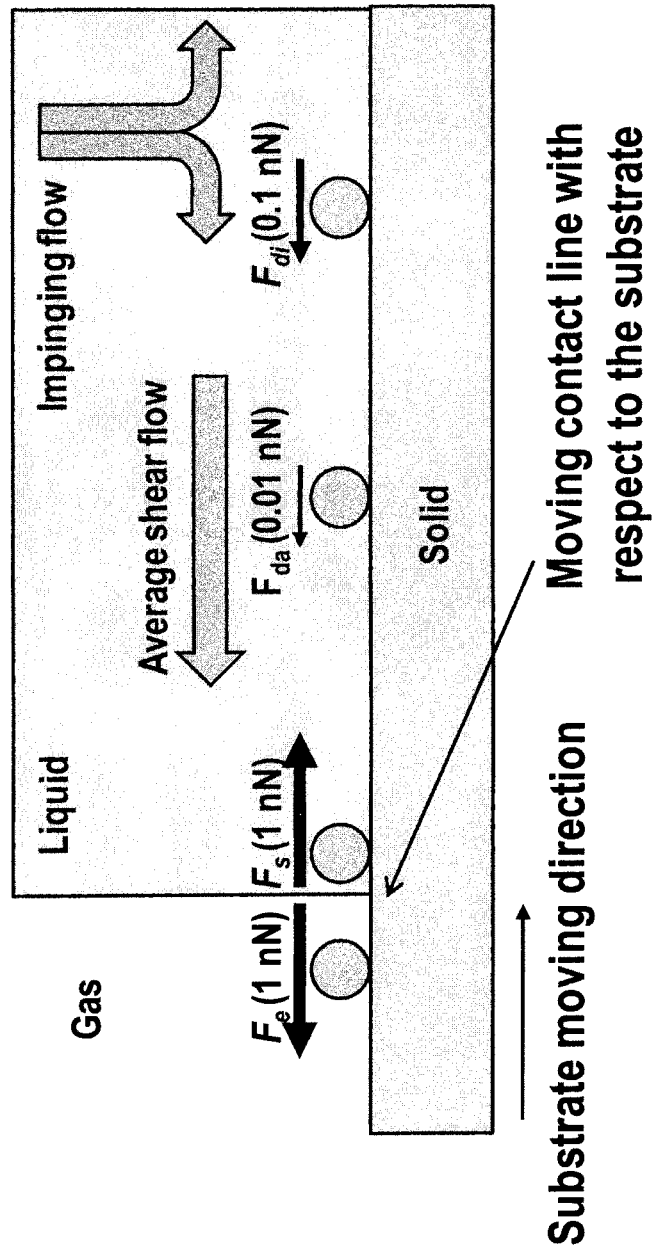
FIG. 4C illustrates various forces acting on particles as a liquid meniscus advances over a solid surface, in accordance with an embodiment of the invention.

FIG. 4C illustrates various forces acting on particles as a liquid meniscus advances over a solid surface, in accordance with an embodiment of the invention. A force $F_e$ pushes against the particle at the meniscus leading edge due to fringe elasticity. A shear stress $F_s$ exists inside the advancing liquid in the vicinity of the moving contact line. A hydrodynamic drag force $F_{da}$ is due to the average shear flow present inside the meniscus away from the contact line and supply hole. Another hydrodynamic drag force $F_{di}$, is due to the shear flow inside a supply hole. $F_e$ and $F_s$ are approximately of the same order of magnitude, and are approximately one order of magnitude greater than $F_{di}$, which is in turn approximately one order of magnitude greater than $F_{da}$.

Figure 5A:
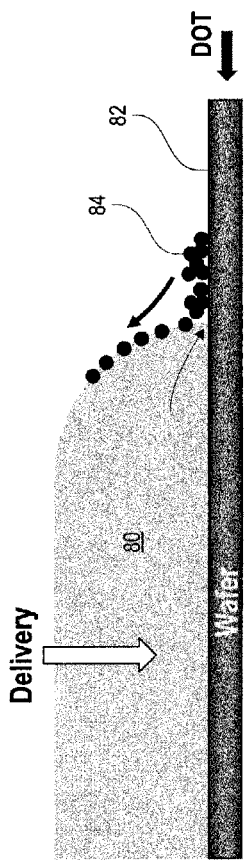
FIGS. 5A and 5B illustrate the mechanism of streak formation produced by a meniscus advancing over a substrate, in accordance with an embodiment of the invention.
Figure 5B:
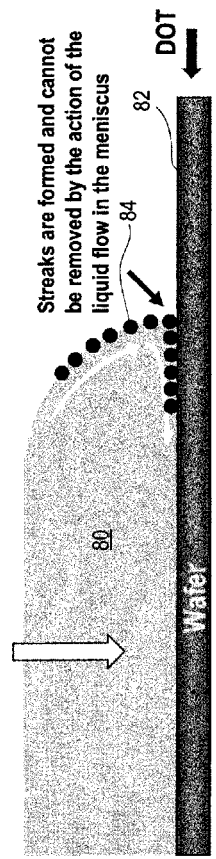

FIGS. 5A and 5B illustrate the mechanism of streak formation produced by a meniscus advancing over a substrate, in accordance with an embodiment of the invention. At FIG. 5A, a meniscus 80 is shown advancing over a surface of substrate 82. As this occurs, there is a three-phase contact line 86 (solid-liquid-air interface) which advances over the substrate 82. Phobic and partially phobic particles 84 present on the surface of the substrate 82 are dislodged from the substrate by the liquid surface tension of the meniscus 80 as the three-phase contact line 86 advances. Some of these particles are removed by the returned liquid flow produced by an outer return-type proximity head. However, as shown at FIG. 5B, some of the particles will roll over the substrate surface (surface transport). And phobic particles in particular will tend to concentrate at the meniscus leading edge, as they are segregated from the liquid meniscus due to its surface tension. Particles will tend to be driven towards the substrate surface by the liquid flow at the meniscus leading edge. The result is that particles will be deposited in streaks along the substrate.

Figure 5C:
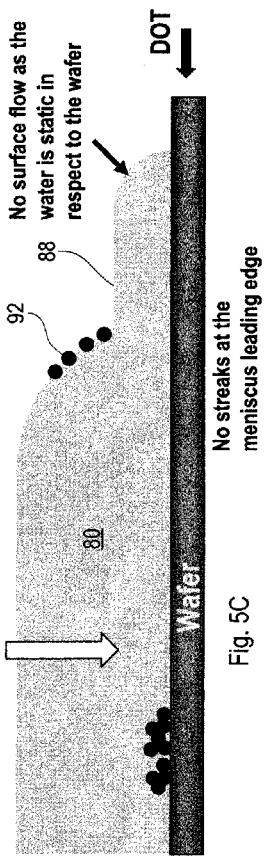
FIG. 5C illustrates an advancing meniscus over a pre-wetted substrate surface, in accordance with an embodiment of the invention.

FIG. 5C illustrates an advancing meniscus over a prewetted substrate surface, in accordance with an embodiment of the invention. As shown, the surface of the substrate 82 has been prewet with a liquid 88 in a manner that produces no substantial surface flow, such that the liquid is substantially static with respect to the substrate. As a result, there is no longer a moving three-phase contact line, as the leading edge of the advancing meniscus 80 only contacts the prewetting liquid 88, and not the substrate surface directly. The surface flow of the meniscus liquid and particles towards the wafer substrate surface is thereby suppressed, inhibiting the formation of streaks. And particles 92 which may be present at the meniscus leading edge are not deposited on the surface of the substrate 82 because the prewetting liquid suppresses the surface flow towards the substrate at the meniscus leading edge.

Figure 6B:
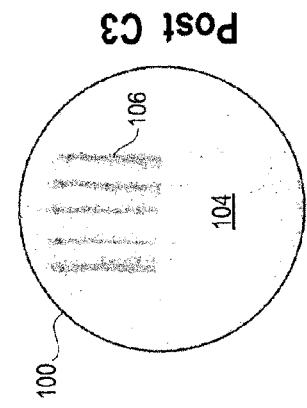
FIGS. 6A and 6B illustrate the effect of a prewetting layer on particle streaking during meniscus processing of a substrate by a physical confinement-type proximity head, in accordance with an embodiment of the invention.
Figure 6A:
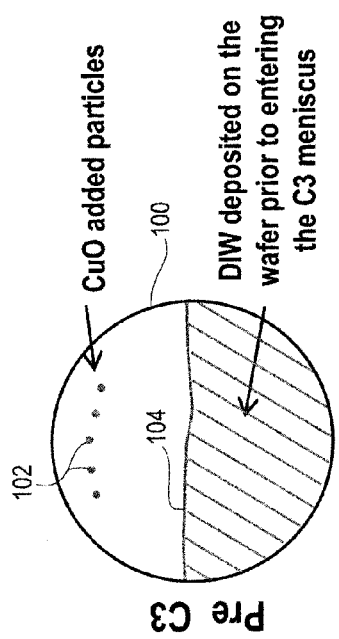

FIGS. 6A and 6B illustrate the effect of a prewetting layer on particle streaking during meniscus processing of a substrate by a physical confinement-type proximity head, in accordance with an embodiment of the invention. At FIG. 6A, a substrate 100 is shown having a plurality of CuO particles 102 placed thereon. Additionally, a region 104 is prewetted by applying a layer of deionized water or IPA or a solution of IPA in DIW over the region 104 prior to meniscus processing with a physical confinement-type proximity head. FIG. 6B illustrates the results of processing substrate 100. As can be seen, particle streaks 106 are observed on the portion of the substrate 100 that did not receive the prewetting treatment. However, in the region 104 which received the prewetting treatment, no particle streaks are observed.

Figure 7B:
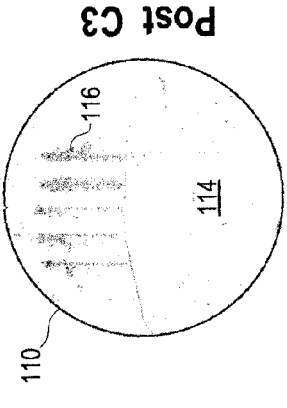
FIGS. 7A and 7B illustrate the effect of a prewetting layer on particle streaking during meniscus processing of a substrate by an outer return-type proximity head, in accordance with an embodiment of the invention.
Figure 7A:
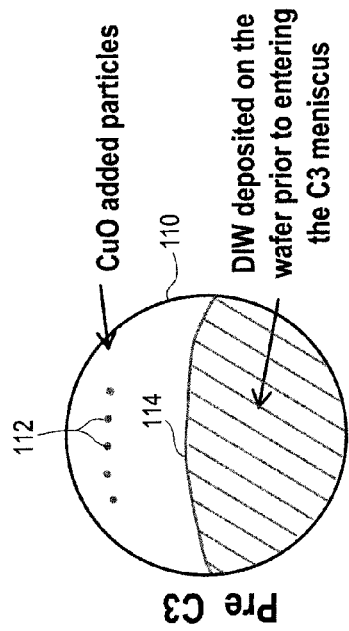

FIGS. 7A and 7B illustrate the effect of a prewetting layer on particle streaking during meniscus processing of a substrate by an outer return-type proximity head, in accordance with an embodiment of the invention. At FIG. 7A, a substrate 110 is shown having a plurality of CuO particles 112 placed thereon. Additionally, a region 114 is prewetted by applying a layer of deionized water or IPA or a solution of IPA in DIW over the region 114 prior to meniscus processing with an outer return-type proximity head. FIG. 7B illustrates the results of processing substrate 110. As can be seen, particle streaks 116 are observed on the portion of the substrate 110 that did not receive the prewetting treatment. However, in the region 114 which received the prewetting treatment, no particle streaks are observed.

FIGS. 8A and 8B illustrate the effect of a prewetting layer applied to an entire surface of a substrate, in accordance with an embodiment of the invention. FIG. 8A shows a substrate 120 having CuO particles 122 deposited thereon. Significant streaks 124 are formed by meniscus processing as the particles 122 are dragged across the substrate surface. FIG. 8B illustrates the same situation but with a substrate 130 being prewetted prior to meniscus processing. As can be seen, CuO particles 132 are not significantly dragged by the meniscus and the streaking is eliminated. Particles may be moved in the direction of travel by the hydrodynamic force $F_{da}$ discussed with reference to FIG. 4C.

FIGS. 9A and 9B illustrate the effect of prewetting on a substrate having a scratched surface, in accordance with an embodiment of the invention. FIG. 9A illustrates a substrate 140 having a scratch 142, that has been meniscus processed without prewetting. As shown, particles generated by the scratch 142 are spread across the substrate surface by the meniscus processing, resulting in a large streak of particles 144. FIG. 9B illustrates a substrate 150 with a scratch 152, the substrate 150 been prewetted prior to meniscus processing. The result is that no significant streaking is observed, as the prewetting prevents migration and redeposition of particles from the scratch 152 onto the substrate surface.

The aforementioned description has demonstrated the efficacy of prewetting a substrate prior to meniscus processing, thereby reducing or altogether eliminating the dragging or streaking of particles that would otherwise be caused by meniscus processing. In various embodiments, the prewetting liquid may include deionized water, isopropyl alcohol (IPA), or other liquids which are compatible with the meniscus processing chemistry for which the substrate is being prewet. In various embodiments, any compatible liquid may be utilized as a prewetting liquid provided it can be deposited on the substrate surface without substantially generating surface flow, so as to be substantially static relative to the substrate and prevent direct contact of the meniscus leading edge with the substrate surface, while achieving complete surface coverage of the region over which it is deposited.

Embodiments of the invention are drawn to methods, apparatus, and systems which deposit a prewetting liquid on a substrate surface without substantially generating surface flow of the prewetting liquid on the substrate. As understood within the context of this disclosure, deposition without generation of substantial surface flow means that at the surface of the prewetting liquid when deposited, there is little overall motion, such that the surface of the prewetting liquid exhibits little to no overall flow direction. This absence of substantial surface flow is to be distinguished from the constant molecular motion which occurs within any liquid and which may produce microcurrents within the liquid. Such molecular motion in and of itself does not in aggregate produce an overall directional flow at the surface of the prewetting liquid absent an additional force of some kind.

It will be apparent to those skilled in the art that in various embodiments, the particular method or apparatus utilized for prewetting the substrate may vary to a considerable extent without departing from the spirit and scope of the invention. For example, in one embodiment, a prewetting liquid is flowed onto a central portion of the substrate, and flows outward so as to cover the substrate with the prewetting liquid prior to meniscus processing. While the advancement of the prewetting fluid from the center to the periphery of the substrate itself will have the same type of surface flow characteristics which cause particle streaking as discussed above, this will not be a problem if the source of particle contaminants lies predominantly near or at the edge of the substrate. It will be appreciated that any of various apparatus types and designs may be utilized to flow a prewetting liquid onto the substrate.

In another embodiment, the prewetting liquid can be dripped or flowed onto the substrate in a manner that substantially limits or prevents surface flow of the prewetting liquid over the substrate. In other words, the prewetting liquid is deposited onto the substrate in a manner such that once on the surface of the substrate, the prewetting liquid is substantially static with respect to the substrate. In one embodiment, a prewetting dispense head is attached to a proximity head to deposit the prewetting liquid to form a prewetting film immediately prior to the application of the meniscus by the proximity head. The flow or drip rate of the prewetting liquid can be matched with the speed of travel of the substrate so as to provide for minimal surface flow of the prewetting liquid over the substrate.

The protective liquid layer can be deposited on the process wafer in a variety of ways. In the tools where single wafers are moved linearly in a process chamber, one can take advantage of this linear motion and deposit the liquid from a static bar or head letting the liquid drip from this head for the entire diameter of a wafer. The head design can be configured to provide uniform deposition of liquid on the process wafer in the direction normal to the direction of wafer travel. The motion of the process wafer under said head is controlled to provide the uniform deposition of the protective liquid on the wafer in the direction of wafer travel. The combination of the wafer motion and the head design allows for the uniform deposition of the protective liquid film on the process wafer.

Figure 10A:
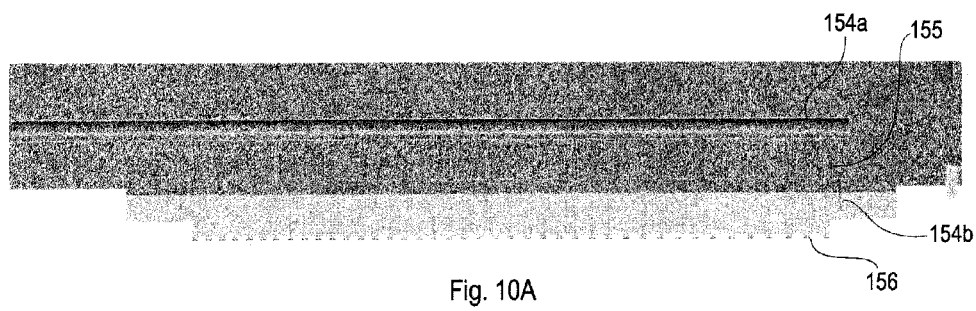
FIG. 10A illustrates a dripping head for the coating of a process wafer with a protective liquid film, in accordance with an embodiment of the invention.

An example of a dripping head for the coating of the process wafer with a protective liquid film is shown at FIG. 10A. Here, a system of cavities 154*a* and 154*b* and down-feeds 155 are designed to provide a uniform flow at the process wafer surface. A number of discrete holes 156 distribute the protective liquid over the process wafer surface. The number of holes may vary approximately between 20 and 40. The diameter of the holes may vary between 0.025" and 0.060" or larger. In one embodiment, the holes have a diameter of approximately 0.030"-0.040". The spacing between holes may be uniform if the wafer travels in a straight line (e.g. 2300 Serene system manufactured by Lam Research Corporation) or constantly changing if the wafer travels in a circular arc (e.g. embodiment shown at FIG. 19). In one embodiment, the individual holes have a "V"-shaped cross-section to facilitate the formation and release of droplets. A recess is present between holes to prevent the agglomeration of neighboring droplets into larger droplets. This dripping head can be operated at a variety of flows, generally between 50 ml/min to 2 l/min or more. The optimum operational flow depends on the contact angle of the protective liquid on the process wafer and on the wafer motion velocity. The objective is to deposit a uniform film over the wafer surface as the wafer moves under the head. A flow of 100-300 ml/min is generally optimal for most conditions with the wafer moving at a velocity near 20 mm/s.

Figure 10B:
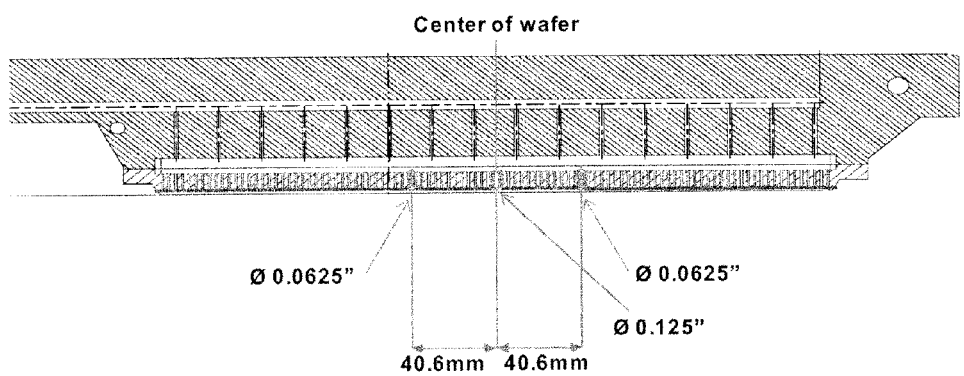
FIGS. 10B and 10C illustrate examples pre-wetting heads for flowing a protective liquid over a substrate surface, in accordance with embodiments of the invention.
Figure 10C:
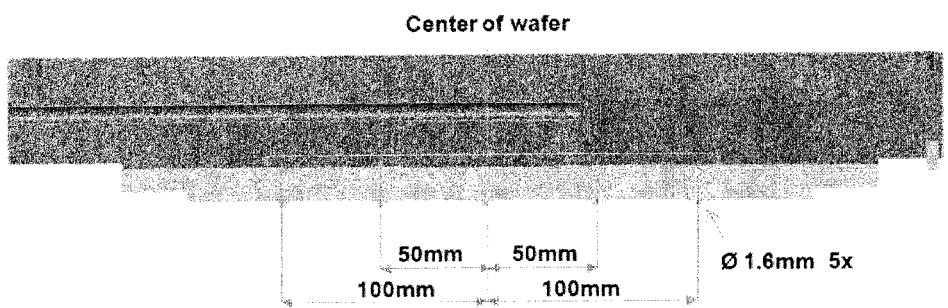

In the situation where particles are only present on the wafer bevel, a prewetting process can be configured to flow the protective liquid over the wafer surface with no danger of transporting particles and forming streaks during the liquid film deposition phase. Pre-wetting heads with 1, 3, 5, and more holes have been tested, all with reasonable success (up to 9 holes). FIGS. 10B and 10C illustrate examples of such pre-wetting heads. In this case, larger flows of the protective liquid can be used. For example, typical flows are between 1 and 3 L/min. The flow is turned on for a brief period of time as the wafer moves under the pre-wetting head. This way, the protective liquid flows from the middle of the wafer surface, towards the wafer bevel. The volume of protective liquid required to cover the wafer depends on the process wafer philicity, and can vary between about 50 ml for a philic wafer up to 250 ml and more for phobic wafers. The time the protective liquid flow is turned on depends on the flow, the total volume required to cover the wafer and the velocity of the wafer under the pre-wetting head. Typically the flow is on for 3-10 seconds. A pre-wetting head with one single dispense hole can work on philic wafers, where the protective liquid has the tendency of spreading on the process wafer surface. In the case of phobic wafers, 5 or more holes are generally required in the pre-wetting head to help spread the protective liquid layer on the wafer surface. In various embodiments, holes may have diameters between 0.060" and 0.125", or may be smaller or larger. In various embodiments, the separation between holes may be between 40 and 100 mm, or larger or smaller. The holes are separated by a recess to prevent the agglomeration of multiple liquid streams in one (to help uniform wafer coverage).

Deionized water (DIW) is one example of a liquid which can be used as a protective liquid layer. However, other liquids can also be used for this purpose. In particular, low surface energy liquids have two significant advantages: (1) The protective liquid has a better tendency to wet the process wafer surface, making it easier to achieve a uniform liquid film coverage; (2) The protective liquid has less tendency to drag particles as it spreads over the surface of the process wafer, so reducing the probability of forming particle streaks during the deposition of the protective liquid layer over the wafer surface.

Figures 10D, 10E:
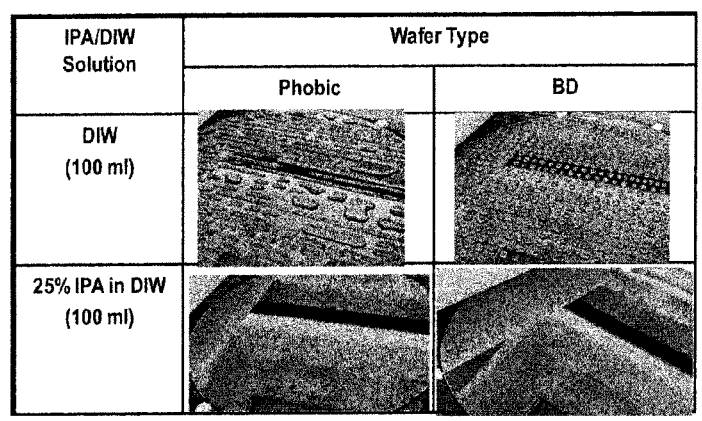
FIG. 10D shows the effects of prewetting with various liquid types, in accordance with embodiments of the invention.
FIG. 10E illustrates a comparison of the use of DIW and 25% IPA/DIW solution on phobic wafer surfaces, in accordance with embodiments of the invention.

FIG. 10D shows the effects of prewetting with various liquid types, in accordance with embodiments of the invention. As shown, the following liquids are used as a protective layer: DIW, 25% IPA/DIW solution, 50% IPA/DIW solution, and IPA. In all cases, streaks generated by the process meniscus liquid are greatly reduced or completely eliminated by the use of a protective liquid layer prior to entering the process meniscus. However, streaks are present in the direction of wafer travel in the case DIW is used as protective liquid. These streaks are formed as the DIW protective film advances over the wafer surface. This effect is not present when IPA or IPA/DIW solution is used as protective liquid film. This is confirmed on both philic and phobic process wafers. The use of a protective liquid layer of low surface energy prevents dragging particles and streak formation during the phase of deposition of the protective liquid film. This, in turn, simplifies the head design for proper deposition of the protective liquid layer. Both head design types referenced above will be effective for the deposition of a low surface energy protective liquid. Other designs capable to spread a protective liquid film will also work. Among these a high temperature saturated stream of IPA vapor in a carrier gas (for example $N_2$) can be directed to the cooler process wafer surface. In this manner, a liquid layer of protective IPA is deposited on the wafer.

Another advantage of the use of low surface energy protective liquids is their prompt capability to spread on the surface of the process wafer. FIG. 10E illustrates a comparison of the use of DIW and 25% IPA/DIW solution on phobic wafer surfaces. A blanket Si wafer is made phobic by exposure to HF. The wafer referred to as "BD" has a black diamond film on its surface. 100 ml of DIW cannot form a uniform liquid film on these wafers as it de-wets. The 25% IPA/DIW solution wets the surface of these wafers and yields a uniform protective liquid layer. The same effect can be obtained with other low surface energy liquids. In some embodiments, liquids with a surface energy lower than about approximately 30 mN/m are preferred.

Figure 11C:
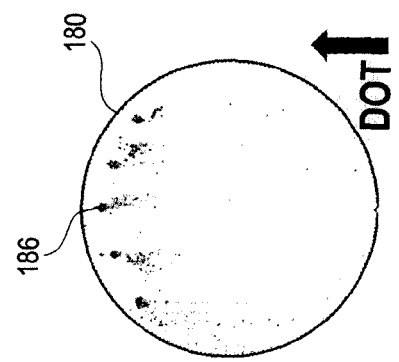
FIG. 11C illustrates the results of meniscus processing a substrate utilizing a proximity head having a vapor delivery mechanism associated therewith, in accordance with an embodiment of the invention.
Figure 11A:
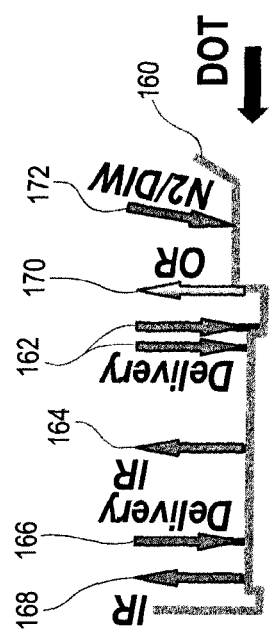
FIG. 11A is a schematic of a proximity head having a vapor delivery mechanism for delivering such a prewetting vapor, in accordance with an embodiment of the invention.

In another embodiment, the prewetting liquid may be condensed from a prewetting vapor onto the substrate surface. In one embodiment, the prewetting vapor can consist of the prewetting liquid in a carrier gas. In some embodiments, the vapor is a supersaturated vapor, to promote rapid condensation on the surface to which the vapor is directed. In some embodiments, the carrier gas is an inert gas such as nitrogen or the like. FIG. 11A is a schematic of a proximity head having a vapor delivery mechanism for delivering such a prewetting vapor, in accordance with an embodiment of the invention. As shown, the proximity head 160 includes delivery conduits 162 and 166, inner return conduits 164 and 168, an outer return 170, and a vapor delivery conduit 172. The vapor delivery conduit 172 is positioned at the foremost portion of the proximity head 160, so as to deposit the prewetting liquid onto the substrate immediately prior to its processing by the meniscus.

Figure 11B:
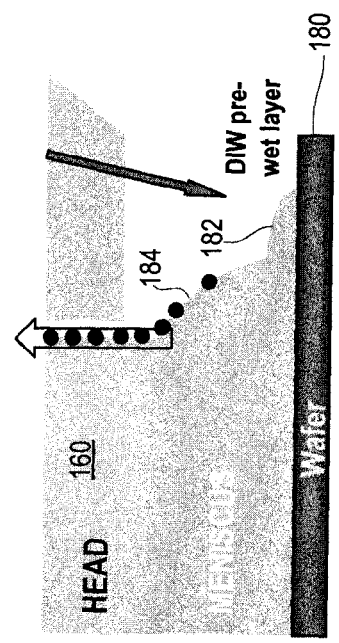
FIG. 11B schematically illustrates the formation of the prewetting liquid layer from a vapor, in accordance with an embodiment of the invention.

FIG. 11B schematically illustrates the formation of the prewetting liquid layer from a vapor, in accordance with an embodiment of the invention. As shown, the prewetting liquid layer 182 is condensed onto the surface of the substrate 180 immediately prior to the application of the leading edge of the meniscus 184. In a sense, the prewetting liquid layer 182 is "grown" on the substrate surface through condensation from the prewetting vapor. The prewetting liquid layer 182 is thus static with respect to the substrate 180, and does not exhibit any substantial surface flow. FIG. 11C illustrates the results of meniscus processing a substrate utilizing such a proximity head having a vapor delivery mechanism associated therewith. As can be seen, the application of the prewetting liquid via the delivery of the prewetting vapor substantially prevents streaking of particles 186 across the substrate surface.

Figure 11D:
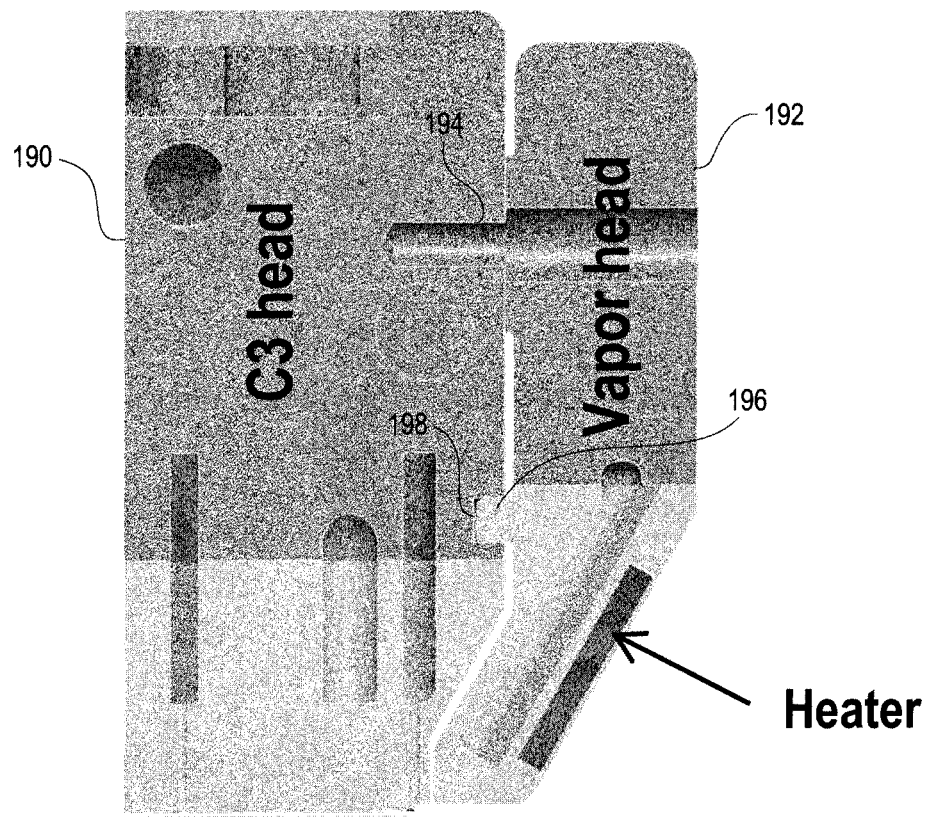
FIG. 11D illustrates a proximity head with a vapor head attached thereto, in accordance with an embodiment of the invention.

FIG. 11D illustrates a proximity head with a vapor head attached thereto, in accordance with an embodiment of the invention. As shown, a vapor head 192 is affixed to a proximity head 190. In various embodiments, the vapor head 192 can be attached to proximity head 190 utilizing any of various methods and devices, such as screws, bolts, clips, interference fit, epoxy, glue, heat welding, etc. In one embodiment, the vapor head 192 is affixed to the proximity head 190 by a bolt 194. Additionally, the vapor head 192 includes a protrusion 196 that mates with an alignment recess 198 to properly align the vapor head relative to the proximity head. In one embodiment, the vapor head 192 can be affixed to the proximity head 190 in a manner such that the positioning of the vapor head relative to the proximity head is adjustable. This can enable one to adjust the horizontal and/or vertical positioning of the vapor head relative to the proximity head so as to deposit a prewetting liquid layer on the substrate surface with minimal surface flow and at a suitable position ahead of the meniscus.

Figure 12A:
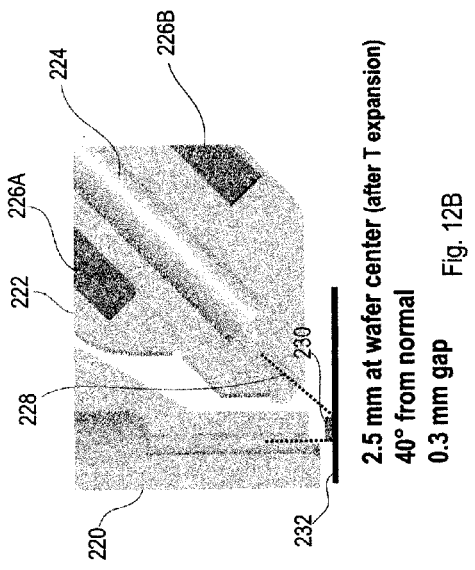
FIG. 12A illustrates a close-up cross-section of a vapor head attached to a single pass type proximity head, in accordance with an embodiment of the invention.

FIG. 12A illustrates a close-up cross-section of a vapor head attached to a single pass type proximity head, in accordance with an embodiment of the invention. As shown, vapor head 202 is coupled to proximity head 200. The vapor head 202 includes a vapor delivery conduit 204 and a heater 206 for heating the prewetting liquid in a carrier gas to form the prewetting vapor. The heater 206 is positioned on the side of the vapor head away from the proximity head 200, so as to minimize unwanted heating of the proximity head 200. The vapor head 202 thus delivers a vapor stream 208 to the surface of wafer 212, where it condenses to form the prewetting liquid layer 210. It will be apparent to those skilled in the art that in various embodiments, the particular orientation of the vapor head may be configured in various ways to provide for proper delivery of the vapor stream to the substrate surface. In the illustrated embodiment, the vapor stream is delivered at an angle that is approximately 20 degrees from normal to the substrate 212. As configured, the length of the exposed prewetting liquid layer 210 (prior to application of the process meniscus over the prewetting liquid layer) is approximately 3.2 millimeters.

Figure 12B:
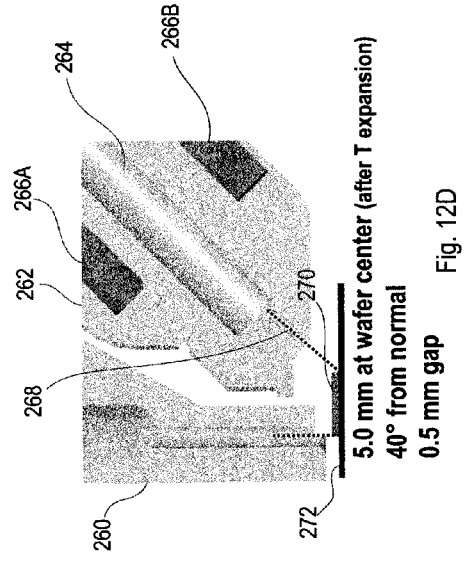
FIG. 12B illustrates a close-up cross-section of a vapor head attached to a single pass type proximity head, in accordance with an embodiment of the invention.

FIG. 12B illustrates a close-up cross-section of a vapor head attached to a single pass type proximity head, in accordance with an embodiment of the invention. As shown, a vapor head 222 is attached to proximity head 220. The vapor head 222 includes a vapor delivery conduit 224 and heaters 226A and 226B positioned on opposite sides of the vapor delivery conduit 224. As the heater 226A is positioned on the side of the vapor head 222 nearest to the proximity head 220, care must be taken to prevent unwanted heating of the proximity head 220. For example, a gap 234 may be configured between the vapor head and the proximity head so as to prevent heating of the proximity head 120. In another embodiment, insulating materials can be utilized in either or both of the proximity head and vapor head to shield the proximity head from the heater of the vapor head. Additionally, the vapor delivery conduit 224 and the heaters 226A and 226B are further angled away from normal relative to the substrate surface as compared to the embodiment of FIG. 12A. This positions the heaters further away from the fluid-containing or otherwise sensitive portions of the proximity head 220. The vapor head 222 is configured to deliver a vapor stream 228 at an angle of approximately 40 degrees from normal relative to the surface of substrate 232. This forms a prewetting liquid layer 230 having a length prior to encountering the process meniscus of approximately 2.5 millimeters.

Figure 12C:
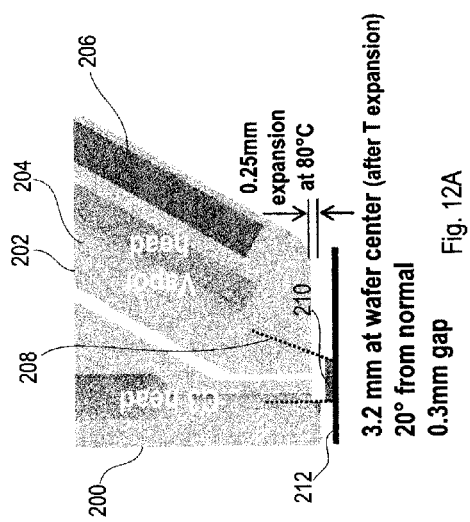
FIG. 12C illustrates a close-up cross-section of a vapor head attached to a reclaim type proximity head, in accordance with an embodiment of the invention.

FIG. 12C illustrates a close-up cross-section of a vapor head attached to a reclaim type proximity head, in accordance with an embodiment of the invention. As shown, the vapor head 242 is attached to proximity head 240. As with the embodiment of FIG. 12A, the vapor head 242 includes a vapor delivery conduit 244 and a heater 246 positioned away from the proximity head 240. The vapor head 242 delivers a vapor stream 248 to the substrate surface at an angle of approximately 20 degrees from normal relative to the surface of substrate 252, and forms an exposed prewetting liquid layer 250 having a length prior to encountering the process meniscus of about 3.1 millimeters long.

Figure 12D:
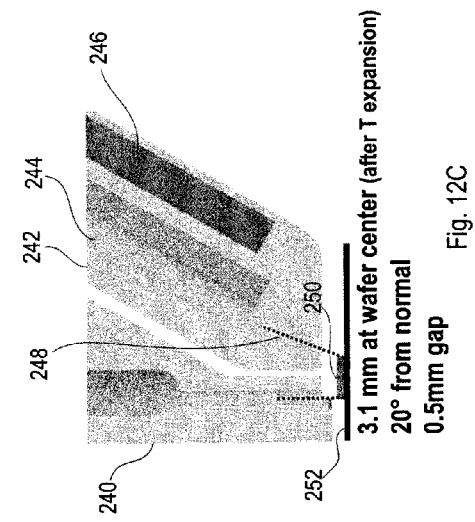
FIG. 12D illustrates a close-up cross-section of a vapor head attached to a reclaim type proximity head, in accordance with an embodiment of the invention.

FIG. 12D illustrates a close-up cross-section of a vapor head attached to a reclaim type proximity head, in accordance with an embodiment of the invention. As shown, the vapor head 262 is attached to proximity head 260. The vapor head includes a vapor delivery conduit 264, and heaters 266A and 266B positioned on opposite sides of the vapor delivery conduit 264. The vapor head 262 provides for a vapor delivery at an angle of about 40 degrees from normal relative to the surface of substrate 272, and condenses a prewetting liquid layer 270 having an exposed length of approximately 5 millimeters.

Figure 13:
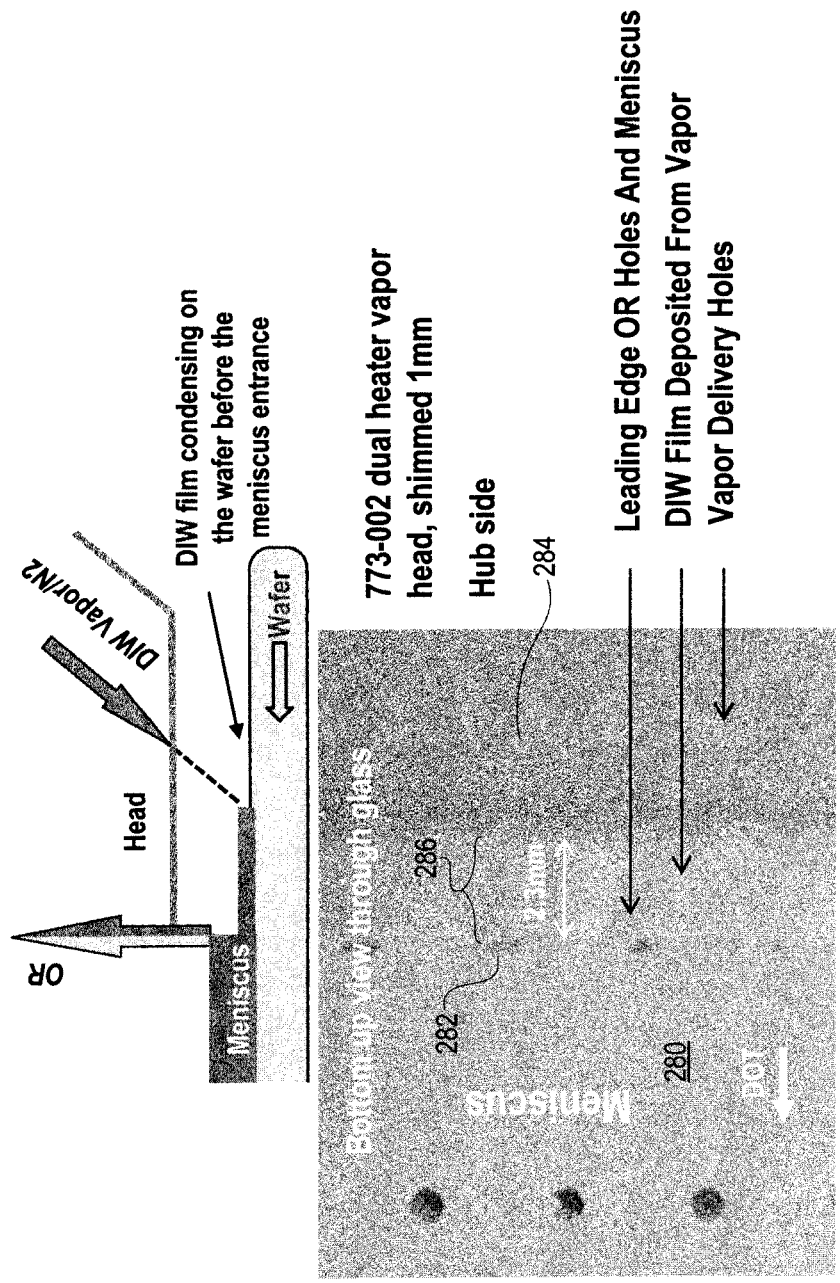
FIG. 13 illustrates a bottom up view through a glass substrate being processed by a proximity head with an attached vapor head, in accordance with an embodiment of the invention.

FIG. 13 illustrates a bottom up view through a glass substrate being processed by a proximity head with an attached vapor head, in accordance with an embodiment of the invention. The glass substrate is processed by the meniscus formed by the proximity head in a meniscus region 280. The outer return holes 282 of the proximity head coincide with the leading edge of the meniscus. The vapor delivery holes 284 of the vapor head deliver prewetting vapor to the substrate. The prewetting vapor condenses a prewetting liquid film 286 onto the substrate prior to the application of the meniscus.

While specific parameters have been provided in this disclosure, it will be appreciated by those skilled in the art that these are intended to be merely exemplary, for in various embodiments the specific parameters of a given system may vary to a considerable extent without departing from the principles of the present invention. For example, the specific amount of prewetting liquid required per unit area of the substrate may depend upon the philicity or phobicity of the substrate. A philic substrate surface will generally require less prewetting liquid, whereas a more phobic surface will require more prewetting liquid per unit area of the substrate in order to adequately prewet the substrate surface. In various embodiments, the amount of prewetting liquid required is the minimal amount necessary to provide adequate coverage of the substrate surface required to suppress the redeposition of particles at the meniscus leading edge. A minimal amount of prewetting liquid is desirable so as to minimize dilution of process chemistry when the meniscus is applied. If the substrate is philic, the pre-wet film will form a layer of uniform thickness. If the substrate is phobic, the pre-wet film may form a uniform layer or it may form discrete droplets, depending on the volume of deposited pre-wet film and the deposition method.

In various embodiments, the amount of prewetting liquid required to adequately prewet a substrate surface may vary approximately between 0.001 $cm^3/cm^2$ and 0.02 $cm^3/cm^2$. This corresponds to an average pre-wet film thickness between 10 and 200 um. The specific flow rate of prewetting liquid or vapor will thus depend upon both the amount of prewetting liquid required to adequately wet the substrate surface and the rate of travel of the substrate. In various embodiments, the substrate travels at a speed of approximately 5 to 22 mm/s. For such speeds, when flowing a prewetting liquid onto the substrate surface, a flow rate of approximately 25 to 1200 ml/min uniformly distributed over the 300 mm diameter of the wafer surface can be utilized. Whereas, when flowing a prewetting vapor onto the substrate surface, a flow rate of approximately 5 to 15 ml/min can be utilized.

While specific embodiments have been described by way of example, it will be appreciated that in various other embodiments, the specific parameters of a vapor head and its positioning relative to a proximity head may vary. For example, the angle of vapor delivery may vary between about normal to the substrate surface to approximately 60 degrees from normal. In some embodiments, the angle of vapor delivery varies between approximately 20 to 40 degrees from normal.

Additionally, it will be appreciated that devices for prewetting a substrate may be incorporated into various types of processing systems. For example, in a linear meniscus processing system, a wafer is transported in a linear fashion through a pair of meniscus processing heads. The processing heads can be configured to have vapor heads or another type of prewetting liquid dispenser for prewetting a portion of the wafer surface prior to its exposure to the meniscus generated by the processing head.

FIG. 14 illustrates meniscus processing of a substrate with a prewet operation, in accordance with an embodiment of the invention. As shown, a substrate 290 is undergoing meniscus processing by a proximity head 292 and a prewet dispense head 294. The proximity head 292 forms a meniscus 296 over a surface region of the substrate 290. The prewet dispense head deposits a prewetting liquid 298 onto a surface region of the substrate 298 that is adjacent to the surface region over which the meniscus 296 is formed. The meniscus 296 has a leading edge 300 and the deposited prewetting liquid 298 has an outer surface 304. The leading edge 300 of the meniscus 296 and the outer surface 304 of the deposited prewetting liquid intersect at an intersection point 302. Because of the presence of the deposited prewetting liquid 298, the leading edge 300 of the meniscus 296 does not contact a dry surface region of the substrate 290, but only a prewetted surface region.

FIGS. 15A, 15B, and 15C illustrate various stages of processing of a substrate, in accordance with an embodiment of the invention. As shown at FIG. 15A, a proximity head 292 and a prewetting dispense head 294 form a process meniscus 296 and a prewetting layer 298 over the substrate surface at time $T_1$. A surface above zone A of the substrate 290 has been prewetted by the prewetting dispense head 294. However, the surfaces above zones B and C of the substrate 290 remain dry. Because of the presence of the prewetting layer 298, the leading edge of the meniscus 296 does not contact a dry surface of the substrate as exists over zones B and C.

FIG. 15B illustrates the processing of the substrate 290 at a time $T_2$. The substrate 290 has moved such that the meniscus 296 is over zone A and the prewetting layer 298 is over zone B, while the surface above zone C remains dry. As the substrate carries the prewetting layer 298 into the meniscus 296, the prewetting layer mixes with the meniscus liquid, locally diluting the meniscus 296 until the liquids have substantially intermixed. In the illustrated embodiment, his occurs primarily in the portion of liquid above zone A of the substrate 290.

FIG. 15C illustrates the processing of the substrate 290 at a time $T_3$. As shown, the substrate 290 has moved such that the meniscus 296 is now over zones A and B, and the prewetting layer 298 is over zone C. The meniscus liquid over zone B is partially diluted by the prewetting layer 298, whereas the meniscus liquid over zone A is substantially intermixed. Because the prewetting layer 298 is deposited without substantially generating surface flow in the prewetting layer, particles are not dragged or pushed along by the meniscus as would normally occur. Thus, particles which may be present over zones A and B are not dragged over zone C.

FIG. 16 illustrates a processing system 320 for processing a substrate 322, in accordance with an embodiment of the invention. The system 320 includes at least one proximity head 292, and a prewetting dispense head 294. The proximity head 324 is supported by supports 328. Optionally, the system may include additional proximity heads, such as proximity heads 330 and 332. The substrate 290 is supported by a carrier 334, which is moved by a conveyer 336 through the meniscus liquid and prewetting liquid which as dispensed by the proximity head 292 and the prewetting dispense head 294, respectively. In one embodiment, the processing system 320 is filled with an inert gas. In one embodiment, the processing system 320 is maintained at a controlled ambient condition.

Figure 17:
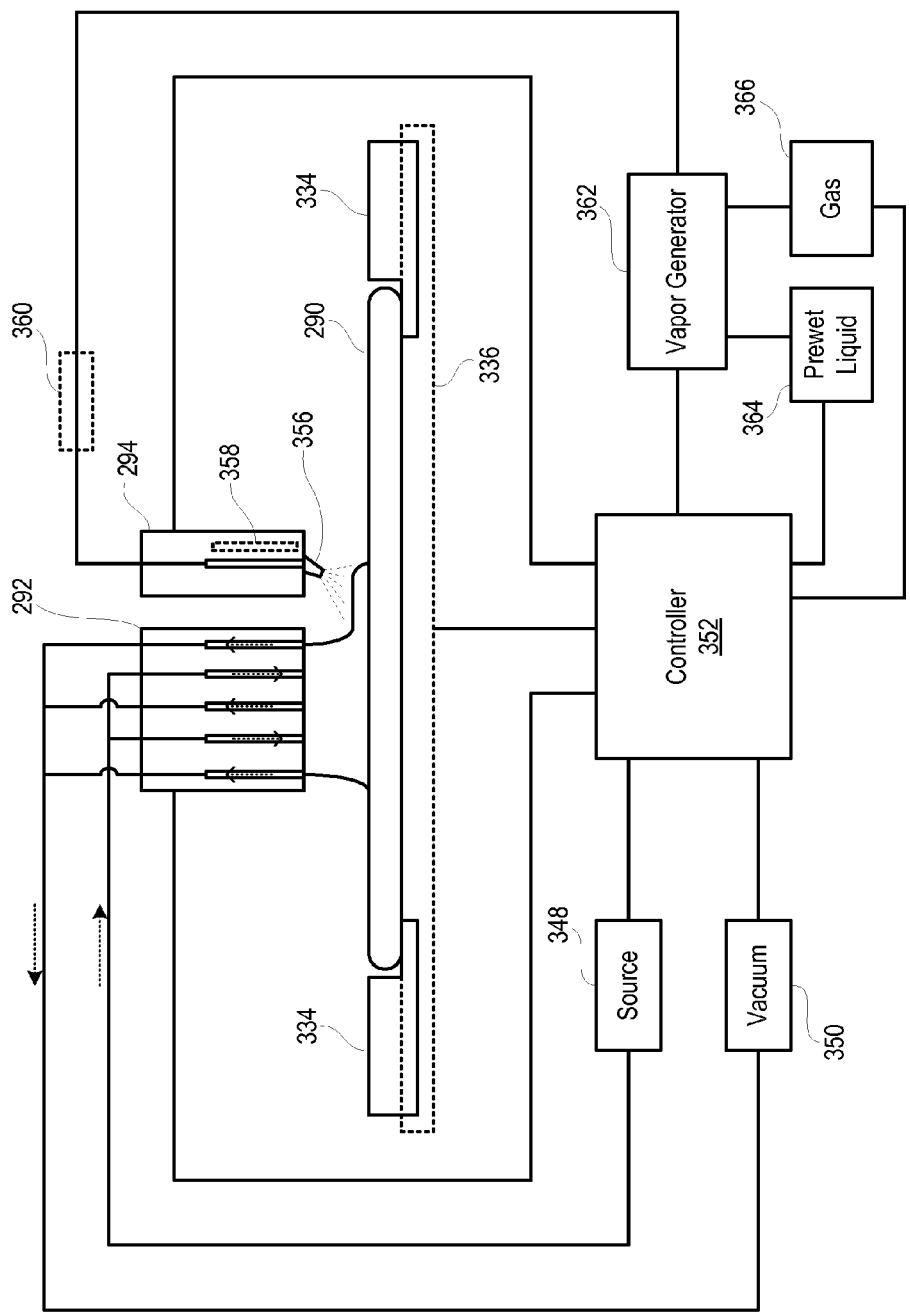
FIG. 17 illustrates a system for substrate processing, in accordance with an embodiment of the invention.

FIG. 17 illustrates a system for substrate processing, in accordance with an embodiment of the invention. As shown, a substrate 290 is supported by a carrier 334, which is moved by a conveyer 336. A proximity head 292 forms a process meniscus on the surface of the substrate 290 for processing, and a prewetting head 294 deposits a prewetting liquid on a region of the substrate adjacent to a region over which the meniscus is generated. Delivery conduits of the proximity head 292 are supplied by a process liquid source 348 and return conduits of the proximity head are connected to a vacuum source 350. In one embodiment, the prewetting head 294 is a vapor head that is supplied by a vapor generator 362. The vapor generator 362 generates a prewetting vapor from a prewetting liquid source 364 and a gas source 366. In some embodiments, the gas source 366 contains an inert gas. The prewetting head 294 may include a heater 358 for heating the prewetting vapor to a supersaturated state before dispensing the vapor over the substrate 340. In one embodiment, a heater 360 is positioned outside the prewetting head 364 to heat the vapor before entering the prewetting head 354. In one embodiment, the prewetting head 356 includes an adjustable nozzle 356 which can be configured to enable adjustment of output direction and/or dispersal.

The controller 352 controls the operation of the various components of the system as illustrated. In particular, the controller 352 controls the flow of the process liquid source 348 to the proximity head 346 and the vacuum supplied by vacuum source 350, so as to enable proper meniscus generation. The controller 352 may also control any adjustable components within the proximity head itself, such as any valves or sensors. Similarly, the controller 352 also controls the flow of prewetting liquid and gas to the vapor generator 362, and controls the vapor generator 362 to provide proper amounts of vapor to the prewetting head 294. The controller 352 may control any adjustable components of the prewetting head 294, such as the heater 358, or adjustable nozzle 356 if present. The controller 352 also controls the conveyer 336 which moves the substrate 340 in its carrier 342. The controller 352 controls the speed of the conveyer 336 and the vapor flow rate from the vapor generator 362 and the prewetting head 354 so that substantially no surface flow occurs in the prewetting liquid once it is deposited on the surface of the substrate 290.

Figure 18:
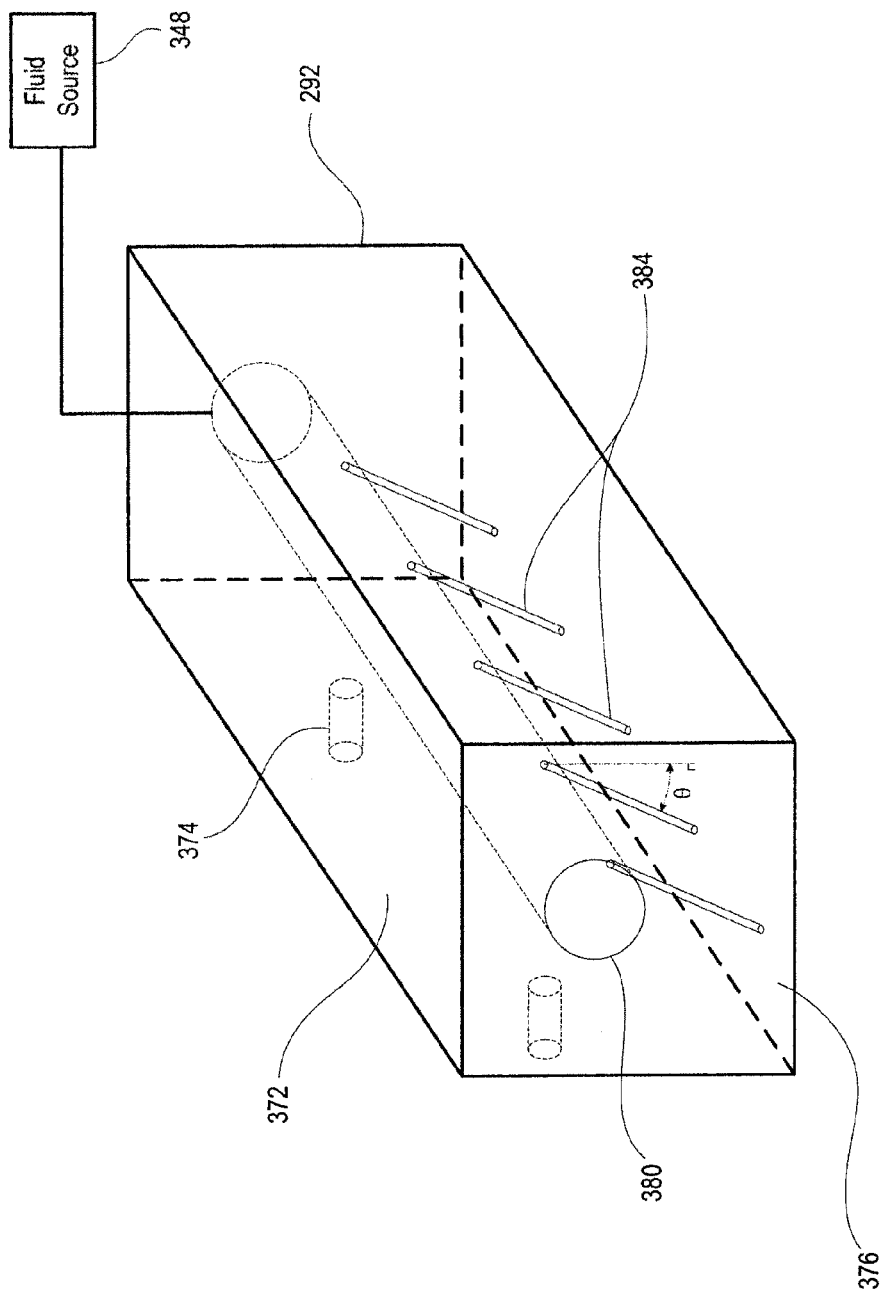
FIG. 18 illustrates a portion of a prewetting head, in accordance with an embodiment of the invention.

FIG. 18 illustrates a portion of a prewetting head, in accordance with an embodiment of the invention. In one embodiment, the prewetting head 294 is defined as a housing having various features defined within or on the housing. The prewetting head 294 is configured for connection to a proximity head. Accordingly, on a proximity head facing side 372 of the prewetting dispense head 294, there are defined one or more connectors 374 which connect to a proximity head. The dispense head 294 includes a fluid supply bore 380 which runs substantially throughout the length of the dispense head 294 and receives prewetting fluid (liquid or vapor) from a prewetting fluid source 348. A plurality of delivery conduits 384 connect from the fluid supply bore 380 to a substrate facing side 376 of the prewetting head 294. The delivery conduits 384 are angled away from normal to the substrate surface towards the proximity head facing side 372 at an angle θ. In this manner, the delivery conduits 384 are directed towards a portion of the substrate surface immediately adjacent to a surface region of the substrate over which the proximity head generates a meniscus. Thus prewetting fluid flows from the supply bore 380 through the delivery conduits 384 to the substrate surface, depositing a prewetting liquid onto the substrate surface. Though not shown, in some embodiments, the dispense head 370 includes one or more heaters for heating the prewetting fluid. The heaters may be defined within the housing and situated proximate to the delivery conduits 384. In one embodiment, heaters are only defined on the side of the delivery conduits 384 opposite the proximity head facing side 372. In other embodiments, heaters are defined on both sides of the delivery conduits 384.

Figure 19:
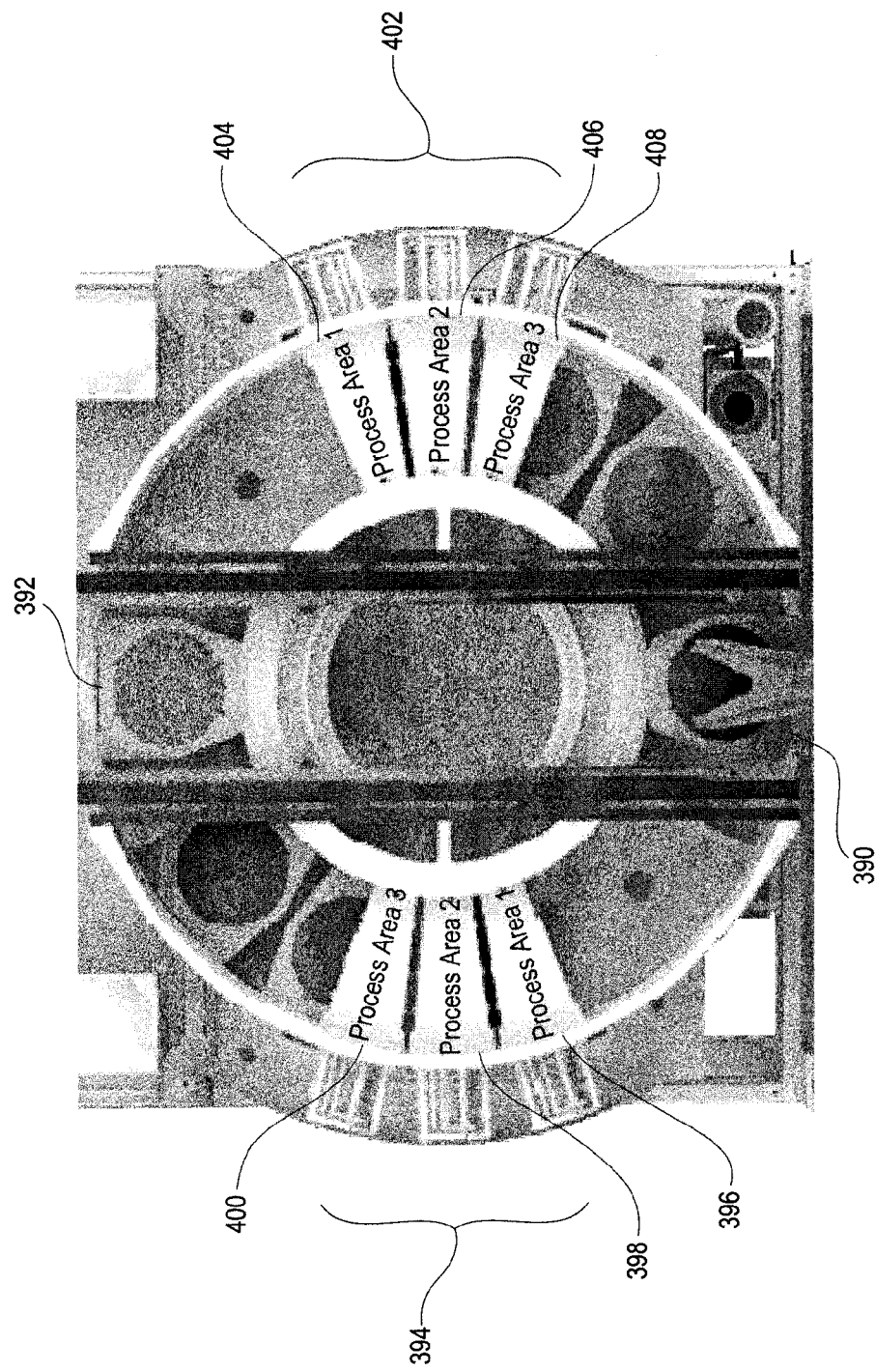
FIG. 19 illustrates a top view of a continuous processing system for meniscus processing of substrates, in accordance with an embodiment of the invention.

FIG. 19 illustrates a top view of a continuous processing system for meniscus processing substrates, in accordance with an embodiment of the invention. The continuous processing system provides a circular path for wafers to travel and be processed. This enables efficient continuous throughput and efficient carrier return. The system includes load/unload stations 390 and 392 which are positioned opposite each other, and process zones 394 and 402 which are positioned opposite each other. The process zone 394 includes process areas 396, 398, and 400, and process zone 402 includes process areas 404, 406, and 408. Each of the process areas can be configured to include one or more proximity heads for meniscus processing and one or more prewetting dispensers, such as a prewetting vapor head, for depositing a prewetting film on a substrate surface.

Figure 20:
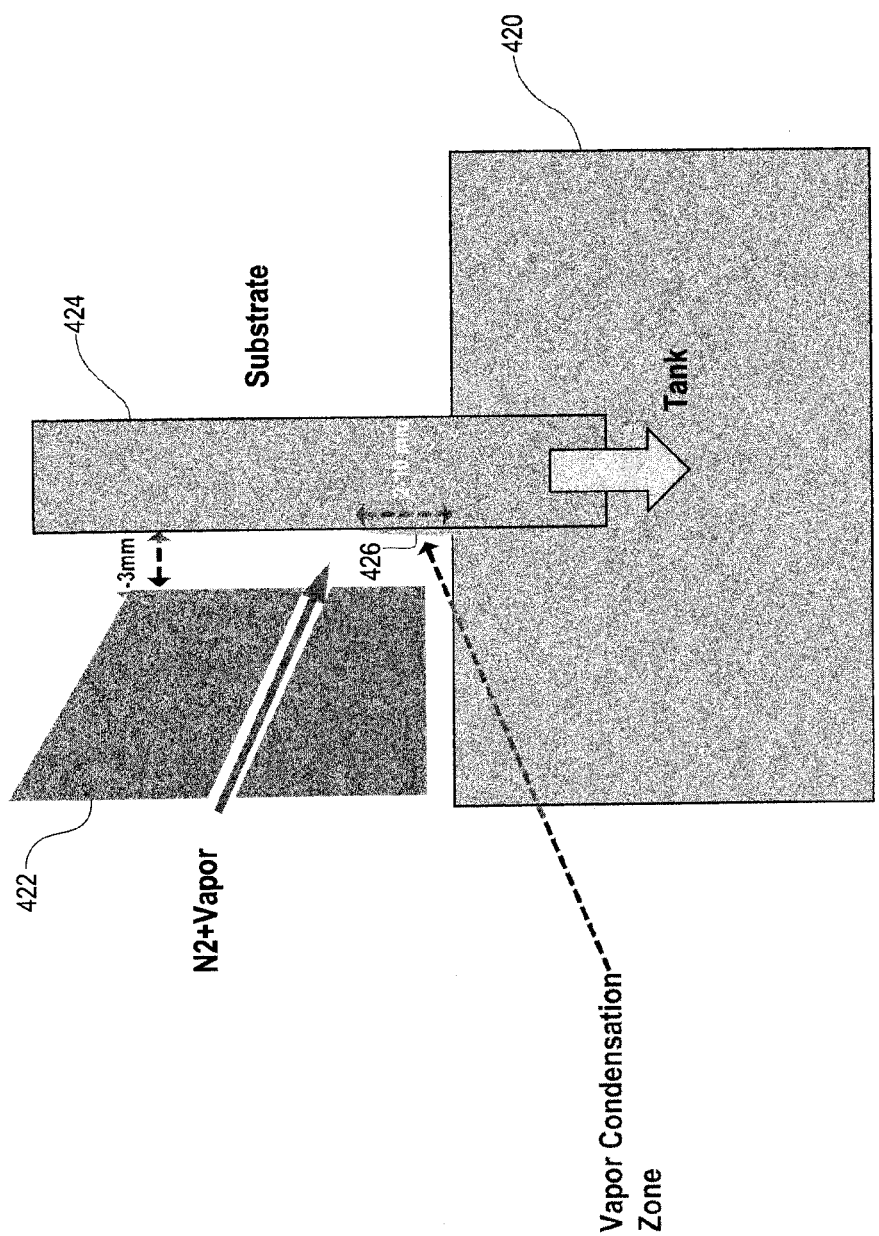
FIG. 20 illustrates a wet bench system for processing a substrate, in accordance with an embodiment of the invention.

FIG. 20 illustrates a wet bench system for processing a substrate, in accordance with an embodiment of the invention. A shown, a tank 420 contains a processing liquid into which a substrate 424 is immersed. A prewetting vapor head 422 is positioned so as to apply a prewetting vapor to a portion of the substrate 424 just before it enters the processing liquid. The prewetting vapor condenses a prewetting liquid film on the portion of the substrate, thereby providing a static layer on the substrate surface prior to its entry into the processing liquid. By providing the prewetting film, the surface of the processing liquid is prevented from directly contacting the substrate surface, thus inhibiting the drag-on of particles due to the surface tension and surface flow of the processing liquid. While only one vapor head is shown on one side of the substrate in the illustrated embodiment, it will be appreciated that in other embodiments, there may be two vapor heads positioned on both sides of the substrate 424.

Figure 21:
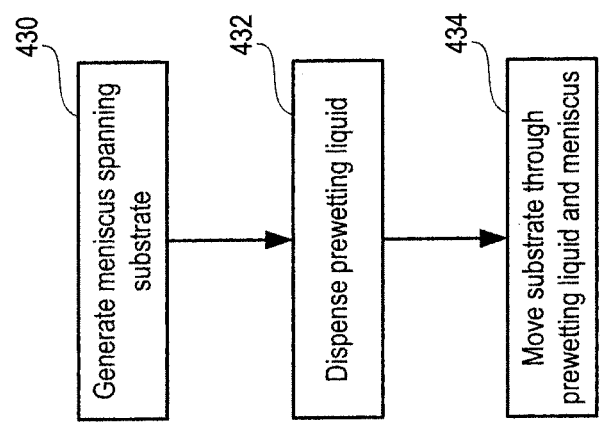
FIG. 21 illustrates a method for meniscus processing a substrate, in accordance with an embodiment of the invention.

FIG. 21 illustrates a method for meniscus processing a substrate, in accordance with an embodiment of the invention. At method operation 430, a meniscus spanning the length of a substrate is generated. At method operation 432, a pre-wetting liquid is dispensed. And at method operation 434, the substrate is moved through the dispensed pre-wetting liquid and the meniscus. The dispensed pre-wetting liquid deposits the pre-wetting liquid over a region of the substrate adjacent to a leading edge of the meniscus. And the pre-wetting liquid is deposited without generating surface flow of the pre-wetting liquid on the substrate, such that the pre-wetting liquid prevents the leading edge of the meniscus from contacting the substrate.

Figure 22:
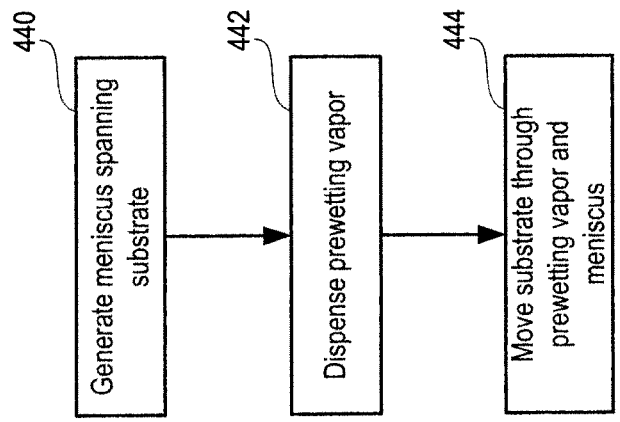
FIG. 22 illustrates a method for meniscus processing a substrate, in accordance with an embodiment of the invention.

FIG. 22 illustrates a method for meniscus processing a substrate, in accordance with an embodiment of the invention. At method operation 440, a meniscus spanning the length of a substrate is generated. At method operation 442, a pre-wetting vapor is dispensed. And at method operation 444, the substrate is moved through the dispensed pre-wetting vapor and the meniscus. The dispensed pre-wetting vapor condenses a pre-wetting liquid over a region of the substrate adjacent to a leading edge of the meniscus. The pre-wetting liquid is deposited without generating surface flow of the pre-wetting liquid on the substrate, such that the pre-wetting liquid prevents the leading edge of the meniscus from contacting the substrate.

While this invention has been described in terms of several preferred embodiments, it will be appreciated that those skilled in the art upon reading the preceding specifications and studying the drawings will realize various alterations, additions, permutations and equivalents thereof. It is therefore intended that the present invention includes all such alterations, additions, permutations, and equivalents as fall within the true spirit and scope of the invention.

What is claimed is:

1. A system for meniscus processing a substrate, comprising:
    a proximity head having a plurality of delivery conduits for providing a process liquid to a surface of the substrate and a plurality of return conduits for removing the process liquid from the surface of the substrate, the plurality of delivery conduits and the plurality of return conduits generating a meniscus spanning at least a length of the first surface of the substrate;
    a pre-wetting dispenser having a plurality of pre-wetting conduits for depositing a pre-wetting liquid over a region of the substrate adjacent to a region of the substrate where the meniscus is generated, such that the pre-wetting liquid prevents a leading edge of the meniscus from contacting a dry surface region of the substrate;
    a conveyer for moving the substrate through the dispensed pre-wetting liquid and the meniscus, such that a surface zone of the substrate is exposed to the pre-wetting liquid prior to being exposed to the meniscus;
    a controller for controlling the conveyer to move the substrate and the pre-wetting dispenser to deposit the pre-wetting liquid such that the pre-wetting liquid is deposited without substantially generating surface flow of the pre-wetting liquid once deposited on the substrate.

2. The system of claim 1, wherein the plurality of pre-wetting conduits are angled towards a direction of travel of the substrate during meniscus processing.

3. The system of claim 1, further comprising,
    a connector for connecting the pre-wetting dispenser to the proximity head.

4. The system of claim 1, wherein the pre-wetting conduits are configured to flow or drip the pre-wetting liquid onto the substrate.

5. The system of claim 1, wherein the plurality of pre-wetting conduits are configured to deposit the pre-wetting liquid by ejecting a vapor onto the substrate and condensing the pre-wetting liquid from the vapor, the vapor including the pre-wetting liquid and a carrier gas.

6. The system of claim 5, wherein the pre-wetting dispenser includes a heater for heating the vapor to a supersaturated state.

7. The system of claim 5, wherein the carrier gas includes nitrogen.

8. The system of claim 5, wherein the pre-wetting liquid includes de-ionized water or isopropyl alcohol.

9. A system for meniscus processing a substrate, comprising:
    a proximity head having a plurality of delivery conduits for providing a process liquid to a surface of the substrate and a plurality of return conduits for removing the process liquid from the surface of the substrate, the plurality of delivery conduits and the plurality of return conduits generating a meniscus spanning at least a length of the first surface of the substrate;
    a pre-wetting dispenser having a plurality of pre-wetting conduits for depositing a pre-wetting liquid over a region of the substrate adjacent to a region of the substrate where the meniscus is generated, such that the pre-wetting liquid prevents a leading edge of the meniscus from contacting a dry surface region of the substrate, the plurality of pre-wetting conduits being angled towards a direction of travel of the substrate during meniscus processing, and the plurality of pre-wetting conduits being configured to deposit the pre-wetting liquid by ejecting a vapor onto the substrate and condensing the pre-wetting liquid from the vapor, the vapor including the pre-wetting liquid and a carrier gas;
    a conveyer for moving the substrate through the dispensed pre-wetting liquid and the meniscus, such that a surface zone of the substrate is exposed to the pre-wetting liquid prior to being exposed to the meniscus;
    a controller for controlling the conveyer to move the substrate and the pre-wetting dispenser to deposit the pre-wetting liquid such that the pre-wetting liquid is deposited without substantially generating surface flow of the pre-wetting liquid once deposited on the substrate.

10. The system of claim 9, further comprising,
    a connector for connecting the pre-wetting dispenser to the proximity head.

11. The system of claim 9, wherein the pre-wetting dispenser includes a heater for heating the vapor to a supersaturated state.

12. The system of claim 9, wherein the carrier gas includes nitrogen.

13. The system of claim 9, wherein the pre-wetting liquid includes de-ionized water or isopropyl alcohol.

14. A system for meniscus processing a substrate, comprising:
    a proximity head having a plurality of delivery conduits for providing a process liquid to a surface of the substrate and a plurality of return conduits for removing the process liquid from the surface of the substrate, the plurality of delivery conduits and the plurality of return conduits generating a meniscus spanning at least a length of the first surface of the substrate;
    a pre-wetting dispenser having a plurality of pre-wetting conduits for depositing a pre-wetting liquid over a region of the substrate adjacent to a region of the substrate where the meniscus is generated, such that the pre-wetting liquid prevents a leading edge of the meniscus from contacting a dry surface region of the substrate, the pre-wetting conduits being configured to flow or drip the pre-wetting liquid onto the substrate, wherein the pre-wetting liquid includes de-ionized water or isopropyl alcohol;
    a conveyer for moving the substrate through the dispensed pre-wetting liquid and the meniscus, such that a surface zone of the substrate is exposed to the pre-wetting liquid prior to being exposed to the meniscus;
    a controller for controlling the conveyer to move the substrate and the pre-wetting dispenser to deposit the pre-wetting liquid such that the pre-wetting liquid is deposited without substantially generating surface flow of the pre-wetting liquid once deposited on the substrate.

* * * * *